(12) United States Patent
Goyal et al.

(10) Patent No.: US 10,771,090 B2
(45) Date of Patent: *Sep. 8, 2020

(54) DATA PROCESSING UNIT HAVING HARDWARE-BASED RANGE ENCODING AND DECODING

(71) Applicant: Fungible, Inc., Santa Clara, CA (US)

(72) Inventors: Rajan Goyal, Saratoga, CA (US); Satyanarayana Lakshmipathi Billa, Sunnyvale, CA (US); Gurumani Senthil Nayakam, Milpitas, CA (US)

(73) Assignee: Fungible, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/711,715

(22) Filed: Dec. 12, 2019

(65) Prior Publication Data

US 2020/0145020 A1 May 7, 2020

Related U.S. Application Data

(63) Continuation of application No. 16/178,341, filed on Nov. 1, 2018, now Pat. No. 10,511,324.

(51) Int. Cl.
*H03M 7/00* (2006.01)
*H03M 7/40* (2006.01)
(Continued)

(52) U.S. Cl.
CPC ...... *H03M 7/4006* (2013.01); *G06F 12/0207* (2013.01); *H03M 7/4093* (2013.01); *H03M 13/45* (2013.01)

(58) Field of Classification Search
CPC .. H03M 7/4006; H03M 13/45; H03M 7/4093; H03M 7/00; H03M 7/3079; G06F 12/0207
(Continued)

(56) References Cited

U.S. PATENT DOCUMENTS 7,796,065 B2 * 9/2010 Fenney ............... H03M 7/4006
341/107
7,813,567 B2 10/2010 Sankaran
(Continued)

OTHER PUBLICATIONS

"Lempel-Ziv-Markov chain algorithm," Wikipedia, the free encyclopedia, accessed from https://en.wikipedia.org/wiki/Lempel-Ziv-Markov_chain_algorithm on or about May 7, 2019, last edit made Mar. 17, 2019, 15 pp.
(Continued)

*Primary Examiner* — Jean B Jeanglaude
(74) *Attorney, Agent, or Firm* — Shumaker & Sieffert, P.A.

(57) ABSTRACT

A highly programmable data processing unit includes multiple processing units for processing streams of information, such as network packets or storage packets. The data processing unit includes one or more specialized hardware accelerators configured to perform acceleration for various data-processing functions. The data processing unit is configured to retrieve speculative probability values for range coding a plurality of bits with a single read instruction to an on-chip memory that stores a table of probability values. The data processing unit is configured to store state information used for context-coding packets of a data stream so that the state information is available after switching between data streams.

26 Claims, 10 Drawing Sheets

(51) Int. Cl.
*G06F 12/02* (2006.01)
*H03M 13/45* (2006.01)

(58) Field of Classification Search
USPC .................................. 341/107, 67, 51, 50
See application file for complete search history.

(56) References Cited

U.S. PATENT DOCUMENTS

| | | | |
|---|---|---|---|
| 7,885,473 B2 | 2/2011 | Sankaran | |
| 7,932,843 B2* | 4/2011 | Demircin | H03M 7/4006 341/107 |
| 8,436,755 B2 | 5/2013 | Korodi et al. | |
| 8,947,273 B2* | 2/2015 | Bartnik | H04N 19/13 341/67 |
| 10,003,356 B2 | 6/2018 | Willner et al. | |
| 10,511,324 B1 | 12/2019 | Goyal et al. | |
| 10,540,288 B2 | 1/2020 | Noureddine et al. | |
| 2009/0241006 A1* | 9/2009 | Liikanen | G06F 11/1072 714/752 |
| 2018/0287965 A1 | 10/2018 | Sindhu et al. | |
| 2018/0293168 A1 | 10/2018 | Noureddine et al. | |
| 2019/0012278 A1 | 1/2019 | Sindhu et al. | |
| 2019/0013965 A1 | 1/2019 | Sindhu et al. | |

OTHER PUBLICATIONS

"Lloyd/easylzma," GitHub, accessed from https://github.com/lloyd/easylzma on or about May 7, 2019, last comment made Apr. 1, 2009, 2 pp.

"Range encoding," Wikipedia, the free encyclopedia, accessed from https://en.wikipedia.org/wiki/Range_encoding on or about May 7, 2019, last edit made Jan. 2, 2019, 6 pp.

Deutsch et al., "ZLIB Compressed Data Format Specification Version 3.3," RFC 1950, Network Working Group, May 1996, 11 pp.

Deutsch, "DEFLATE Compressed Data Format Specifications Version 1.3," RFC 1951, Network Working Group, May 1996, 15 pp.

Deutsch, "GZIP File Format Specification Version 4.3," RFC 1952, Network Working Group, May 1996, 12 pp.

Martin, "Range encoding: an algorithm for removing redundancy from a digitised message," Video & Data Recording Conference, Mar. 1979, 11 pp.

U.S. Appl. No. 16/178,373, filed Nov. 1, 2018, by Billa et al.
U.S. Appl. No. 16/197,179, filed Nov. 20, 2018, by Gray et al.
U.S. Appl. No. 16/746,344, filed Jan. 17, 2020, by Noureddine et al.
Prosecution History from U.S. Appl. No. 16/178,341, dated Jun. 3, 2019 through Aug. 29, 2019, 15 pp.
U.S. Appl. No. 16/791,957, filed Feb. 14, 2020, by Noureddine et al.

* cited by examiner

| offset | 0 | 1 | 2 | 3 | 4 | 5 | ... |
|---|---|---|---|---|---|---|---|
| Un-compressed bytes | u | p | u | n | e | p | ... |

| Letter | Frequency | Interval |
|---|---|---|
| 'u' | 60 | [0,0.6) |
| 'p' | 20 | [0.6,0.8) |
| 'n' | 10 | [0.8,0.9) |
| 'e' | 10 | [0.9,1.0) |

POS_STATE

| STATE | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| 0 | | | | | | | | | | | | | | | | |
| 1 | | | | | | | | | | | | | | | | |
| 2 | | | | | | | | | | | | | | | | |
| 3 | | | | | | | | | | | | | | | | |
| 4 | A | B | C | D | E | F | G | H | I | J | K | L | M | N | O | P |
| 5 | | | | | | | | | | | | | | | | |
| 6 | | | | | | | | | | | | | | | | |
| 7 | | | | | | | | | | | | | | | | |
| 8 | | | | | | | | | | | | | | | | |
| 9 | | | | | | | | | | | | | | | | |
| 10 | | | | | | | | | | | | | | | | |
| 11 | | | | | | | | | | | | | | | | |

DATA PROCESSING UNIT HAVING HARDWARE-BASED RANGE ENCODING AND DECODING

This application is a continuation application of U.S. application Ser. No. 16/178,341, filed on Nov. 1, 2018, the entire content of which is incorporated herein by reference.

TECHNICAL FIELD

The disclosure relates to processing packets of information, for example, in the fields of networking and storage.

BACKGROUND

In a typical computer network, a large collection of interconnected servers provides computing and/or storage capacity for execution of various applications. A data center is one example of a large-scale computer network and typically hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

Many devices within a computer network, e.g., storage/compute servers, firewalls, intrusion detection devices, switches, routers or other network attached devices, often use general purpose processors, including multi-core processing systems, to process data, such as network or storage data. However, general purpose processing cores and multi-processing systems are normally not designed for high-capacity network and storage workloads of modern network and can be relatively poor at performing packet stream processing.

SUMMARY

In general, this disclosure describes a highly programmable device, referred to generally as a data processing unit, having multiple processing units for processing streams of information, such as network packets or storage packets. In some examples, the processing units may be processing cores, and in other examples, the processing units may be virtual processors, hardware threads, hardware blocks, or other sub-processing core units. As described herein, the data processing unit includes one or more specialized hardware-based accelerators configured to perform acceleration for various data-processing functions, thereby offloading tasks from the processing units.

In various examples, this disclosure describes a hardware-based range coder (e.g., encoder and/or decoder) for performing context-based range encoding and decoding. There can be a plurality of contexts used to determine probability values for encoding or decoding bits of a plurality of bits used to represent a symbol. Accordingly, a context-based range coder may access memory that stores the probability value for coding the bit based on context values for the various contexts. In some examples, the context-based coder repeats memory access operations for accessing the memory on a bit-by-bit basis, which can impact throughput (e.g., slow down the number of bits that can be coded per unit of time).

The context-based range coder, described in this disclosure, may retrieve a plurality of probability values for a plurality of bits in response to a single read instruction. For instance, a context value for at least one of the contexts for the plurality of bits may be the same, and the range coder may retrieve the probability values associated with that context value for the plurality of bits in response to the single read instruction. Then for each bit, the range coder may determine the probability value from the retrieved probability values. In some examples, the table of probability values in the memory that stores the probability values may be arranged such that probability values for a plurality of bits having the same context value for a context can be read quickly and in response to a single read instruction. By retrieving the plurality of probability values in response to a single read instruction, the number of read operations that the range coder performs is reduced, which increases processing throughput and promotes memory bandwidth efficiency.

Furthermore, the context-based range coder receives symbols for encoding or decoding from different applications. For example, the context-based range encoder receives packets and outputs compressed stream of bits, and the context-based range decoder receives compressed stream of bits and outputs packets. The context-based range coder may be configured to switch and interleave coding of symbols of different applications (e.g., switch upon completion of coding a packet). For example, the context-based range coder may encode or decode one or more packets of a first application, then encode or decode one or more packets of a second application, and back to encoding or decoding one or more remaining packets of the first application, and so forth.

State information, such as context values and their probabilities, and other information such as range and low values, described below, are different for different applications. Due to interleaving of coding packets from different applications, the context-based range coder may need to switch between state information, which results in the context-based range coder storing the state information each time the context-based range coder switches to coding packets of a different application. The context-based range coder then retrieves the state information when returning back to coding packets of the first application.

In some examples, repeated storing and retrieving of the state information may require extensive memory bandwidth and may substantially slow down the operation of the context-based range coder. This disclosure describes example techniques for compressing state information to reduce the amount of information that needs to be stored and retrieved, and in such a way that latency associated with compression and decompression is minimized.

In one example, the disclosure describes a method of context-based coding, the method comprising determining, by a range coder implemented in circuitry of a device, a first context value for a first context for a plurality of bits of a symbol to be coded, wherein the first context value for the first context is same for the plurality of bits, retrieving, by the range coder in response to a single read instruction issued to an on-chip memory, speculative probability values associated with the first context value for the first context from a table of probability values stored in the on-chip memory, for each bit of the plurality of bits of the symbol, determining, by the range coder, respective second context values for a second context, for each bit of the plurality of bits of the symbol, determining, by the range coder, respective probability values from the retrieved speculative probability values based on at least the respective second context values for the second context, and range coding, by the range coder, each bit of the plurality of bits of the symbol based on the respective determined probability values.

In one example, the disclosure describes a device for context-based coding, the device comprising memory configured to store a table of probability values and a range coder implemented in circuitry. The range coder is configured to retrieve, in response to a single read instruction issued to the memory, speculative probability values associated with the first context value for the first context from the table of probability values stored in the memory, for each bit of the plurality of bits of the symbol, determine respective second context values for a second context, for each bit of the plurality of bits of the symbol, determine respective probability values from the retrieved speculative probability values based on at least the respective second context values for the second context, and range code each bit of the plurality of bits of the symbol based on the respective determined probability values.

In one example, the disclosure describes a method of context-based coding, the method comprising generating state information for context-based coding a first set of one or more packets of an application, compressing the state information to generate compressed state information after coding the first set of one or more packets, decompressing the compressed state information to reconstruct the state information, and context-based coding a second set of one or more packets of the application based on the reconstructed state information.

In one example, the disclosure describes a device for context-based coding, the device comprising a memory and a range coder implemented in circuitry. The range coder is configured to generate state information for context-based coding a first set of one or more packets of an application, compress the state information, for storage in the memory, to generate compressed state information after coding the first set of one or more packets, decompress the compressed state information to reconstruct the state information, and context-based code a second set of one or more packets of the application based on the reconstructed state information.

The details of one or more examples are set forth in the accompanying drawings and the description below. Other features, objects, and advantages of the invention will be apparent from the description and drawings, and from the claims.

BRIEF DESCRIPTION OF DRAWINGS

FIG. 9 is a conceptual diagram illustrating an example of a table of probability values stored in a memory.

DETAILED DESCRIPTION

Figure 1:
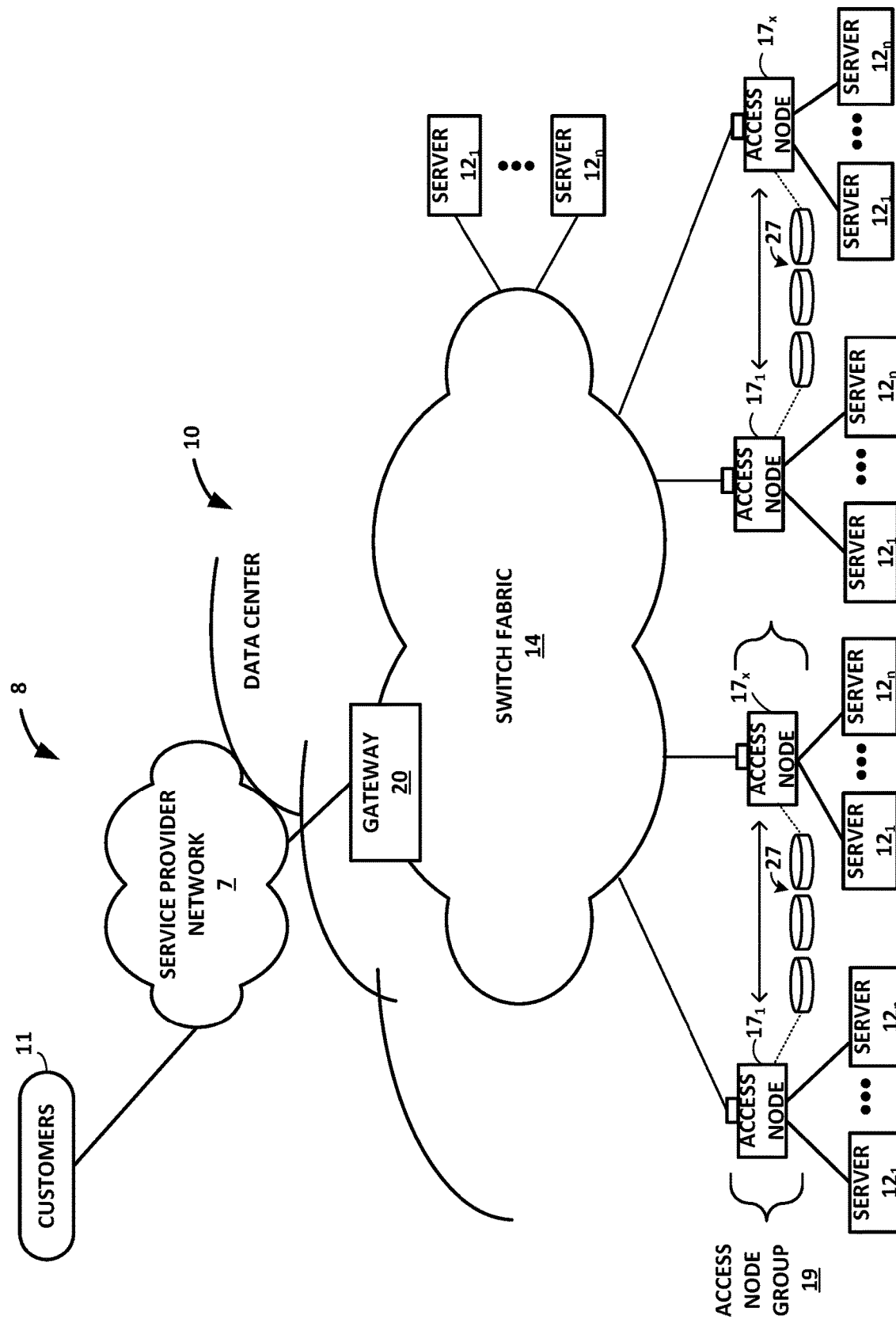
FIG. 1 is a block diagram illustrating an example system including one or more network devices configured to efficiently process a series of work units in a multiple core processor system.

FIG. 1 is a block diagram illustrating an example system 8 including one or more network devices configured to efficiently process a series of work units in a multiple core processor system. As described herein, techniques for parallel decoding variable-length encoded data may provide technical benefits that include improving the throughput and utilization of processing cores within access nodes 17 in FIG. 1.

Access nodes 17 may also be referred to as data processing units (DPUs), or devices including DPUs, in this disclosure. In the example of FIG. 1, various data structures and processing techniques are described with respect to access nodes 17 within a data center 10. Other devices within a network, such as routers, switches, servers, firewalls, gateways and the like, having multiple core processor systems may readily be configured to utilize the data processing techniques described herein.

Data center 10 represents an example of a system in which various techniques described herein may be implemented. In general, data center 10 provides an operating environment for applications and services for customers 11 coupled to the data center by service provider network 7 and gateway device 20. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet. In other examples, content/service provider network 107 may be a data center wide-area network (DC WAN), private network or other type of network.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 14. In some examples, servers 12 are arranged into multiple different server groups, each including any number of servers up to, for example, n servers $12_1$-$12_n$. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, each of servers 12 is coupled to switch fabric 14 by an access node 17 for processing streams of information, such as network packets or storage packets. In example implementations, access nodes 17 may be configurable to operate in a standalone network appliance having one or more access nodes. For example, access nodes 17 may be arranged into multiple different access node groups 19, each including any number of access nodes up to, for example, x access nodes $17_1$-$17_x$. In other examples, each access node may be implemented as a component (e.g., electronic chip) within a device, such as a compute node, application server, storage server, and may be deployed on a motherboard of the device or within a removable card, such as a storage and/or network interface card.

In general, each access node group 19 may be configured to operate as a high-performance I/O hub designed to aggregate and process network and/or storage I/O for multiple servers 12. As described above, the set of access nodes 17 within each of the access node groups 19 provide highly-programmable, specialized I/O processing circuits for handling networking and communications operations on behalf of servers 12. In addition, in some examples, each of access node groups 19 may include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory. Each access node group 19, including its set of access nodes 17 and storage devices 27, and the set of servers 12 supported by the access nodes 17 of that access node group 19 may be referred to herein as a network storage compute unit.

As further described herein, in one example, each access node 17 is a highly programmable I/O processor (referred to as a DPU) specially designed for offloading certain functions from servers 12. In one example, each access node 17 includes a number of internal processor clusters, each including two or more processing cores and equipped with hardware engines that offload cryptographic, compression and decompression, and regular expression (RegEx) processing, data storage functions and networking operations. In this way, each access node 17 includes components for fully implementing and processing network and storage stacks on behalf of one or more servers 12. In addition, access nodes 17 may be programmatically configured to serve as a security gateway for its respective servers 12, freeing up the processors of the servers to dedicate resources to application workloads. In some example implementations, each access node 17 may be viewed as a network interface subsystem that implements full offload of the handling of data packets (with zero copy in server memory) and storage acceleration for the attached server systems. In one example, each access node 17 may be implemented as one or more application-specific integrated circuit (ASIC) or other hardware and software components, each supporting a subset of the servers. Additional example details of various example DPUs are described in U.S. Provisional Patent Application No. 62/559,021, filed Sep. 15, 2017, entitled "Access Node for Data Centers," and U.S. Provisional Patent Application No. 62/530,691, filed Jul. 10, 2017, entitled "Data Processing Unit for Computing Devices," the entire contents of both being incorporated herein by reference.

In accordance with the techniques of this disclosure, any or all of access nodes 17 may include a data compression/decompression accelerator unit. That is, one or more computing devices may include an access node including one or more data compression/decompression accelerator units, according to the techniques of this disclosure.

The data compression/decompression accelerator unit of the access node may be configured to process payloads of packets during various services as the packets are exchanged by access nodes 17, e.g., between access nodes 17 via switch fabric 14 and/or between servers 12. That is, as packets are exchanged between the devices, either for networking or for data storage and retrieval, the access node may perform data compression on payloads of the packet. For example, the access node may use one or more data compression/decompression accelerator units to perform dictionary-based or history-based compression followed by entropy encoding.

In addition to history/dictionary-based compression followed by entropy encoding, the data compression/decompression accelerator unit may be configured to perform the inverse process of entropy decoding followed by history/dictionary-based decompression to reconstruct the original payloads of packets. One example of entropy encoding and entropy decoding is range encoding and range decoding. For example, the data compression/decompression accelerator unit includes a range encoder and a range decoder configured to perform range encoding or decoding.

Range encoding or decoding is used to compress or decompress bits used to represent a symbol. A symbol is the item that is being compressed or decompressed. For example, the symbol may be a literal (e.g., a literal of a byte string) or a length, distance pair indicating a distance value to a previous occurrence of a matching byte string and a length value of the match. Examples of the symbols are described in more detail below. Other examples of symbols exist, and the techniques should not be considered limited to these examples of symbols.

In one example technique for range encoding and decoding, such as context-free range coding, for each symbol (e.g., literal or length, distance pair) there is a frequency value indicative of the frequency at which the symbol occurs in the payload and an interval range based on its frequency. As one example, more frequent symbols are assigned larger interval ranges in a range space, than less frequent symbols. An interval range in a range space of a symbol may generally correspond to how frequent the symbol is in the payload. As an example, assume a first symbol is 60% of the symbols, a second symbol is 20% of the symbols, a third symbol is 10% of the symbols, and a fourth symbol is 10% of the symbols. In this example, assume the range space is set to be 0 to 1. The first symbol may then be assigned a sub-portion of the range space such as range of 0 to 0.6, the second symbol may be assigned a sub-portion of the range space such as range of 0.6 to 0.8 (either range for the first symbol or the second symbol includes 0.6, not both), the third symbol may be assigned a sub-portion of the range space such as range of 0.8 to 0.9 (either range for the second symbol or the third symbol includes 0.8, not both), and the fourth symbol may be assigned a sub-portion of the range space such as a range of 0.9 to 1 (either range for the third symbol or the fourth symbol includes 0.9, not both). The value range assigned to each symbol is proportional to the percentage of their occurrence in the payload.

If a starting symbol in the payload happens to be the first symbol, then the range coder (encoder or decoder) sets a value of 0.6 (e.g., reduces the range to [0, 0.6] from [0, 1]). Then, for the next symbol, the range coder divides the range from 0 to 0.6. For example, the first symbol is assigned the range of 0 to 0.36 because 0.6*60% is 0.36. The second symbol is assigned the range of 0.36 to 0.48 because 0.6*20% plus 0.36 is 0.48. The third symbol is assigned the range of 0.48 to 0.54 because 0.6*10% plus 0.48 is 0.54. The fourth symbol is assigned the range of 0.54 to 0.6 because 0.6*10% plus 0.54 is 0.6.

If the next symbol is the third symbol, then the range coder divides the range from 0.48 to 0.54. For example, the first symbol is assigned the range of 0.48 to 0.516 because (0.54-0.48)*60% plus 0.48 is 0.516. The second symbol is assigned the range of 0.516 to 0.528 because (0.54-0.48) *20% plus 0.516 is 0.528. The third symbol is assigned the range of 0.528 to 0.534 because (0.54-0.48)*10% plus 0.528 is 0.534. The fourth symbol is assigned the range of 0.534 to 0.54 because (0.54-0.48)*10% plus 0.534 is 0.54.

The range coder may then proceed to the next symbol and again assign ranges to the symbols. The range coder may repeat these operations until end of payload, generating a long string of decimal point value that uniquely identifies the symbols that form the payload.

For decoding, the range coder performs a substantially reciprocal operation to reconstruct the symbols of the payload. For instance, the range coder receives a plurality of encoded bits that the range coder uses to determine a sub-portion within the range space. Based on the determined sub-portion within the range space, the range coder can reconstruct the original bit values of the data stream.

Accordingly, the range coder maintains a register referred to as "low" and a register referred to as "range." The low register stores the low value. For instance, in the above example, for the starting symbol, the low value is 0, and then for the next symbol, the low value is 0.48. The range register stores the range value. In some examples, the range value is the extent of the range from the low value, such that the range value plus the low value indicates the high value of the range. For instance, in the above example, for the starting symbol, the range value is 0.6 (e.g., 0.6-0 is 0.6), and then for the next symbol, the range value is 0.06 (e.g., 0.54-0.48 is 0.06). The range coder also stores a table of frequency (e.g., 60% for the first symbol, 20% for the second symbol, 10% for the third symbol, and 10% for the fourth symbol). In this disclosure, the low value and the range value are examples of state information that the range coder maintains for coding a symbol packet.

In the above example, the frequency table, also referred to as table of probability values, was preconstructed. However, in some applications, rather than pre-constructing the frequency table, the range coder may dynamically construct the frequency table. For instance, the range coder may initially assign each symbol the same size range, and the range coder updates the ranges based on how frequently the symbol is found in the payload. The table of probability values is another example of state information that the range coder maintains for coding a symbol packet.

The above example of range coding is a context-free range coding technique. For instance, the range value is based on the frequency of symbols in the payload, but not necessarily based on whether there is higher or lower probability of a grouping of particular symbols. In context-based range coding techniques, the range value is based not only on the frequency of symbols, but other factors, referred to as contexts, that indicate how likely a group of symbols may be.

As an example, assume that a symbol for the letter 'b' (symbol 'b') is 40% of the symbols, and a symbol for the letter 'r' (symbol 'r') is 5% of the symbols. In this example, assume that a starting symbol is the letter 'a.' In the English language, there are approximately 5594 words that start with 'ar' and approximately 2796 words that start with 'ab.' Therefore, although symbol 'b' occurs eight times more often than the symbol 'r', if a starting symbol is 'a', then there is actually a higher chance that the next letter will be 'r' instead of 'b.'

In context-based range coding, the range coder may account for the likelihood of which symbols follow which symbols to determine the range values. Accordingly, the same symbol may be associated with different ranges (also called probability values) based on the likelihood of that symbol following a previous symbol. The likelihood of a symbol following another symbol is one example of a context. There may be other types of contexts as well, such as types of symbols that were previously encoded or decoded, an offset value based on a dictionary (or history) position (described in more detail below), and the like.

In some examples, context-based range coding may be on a bit-by-bit basis for the bits that represent a symbol. For a given symbol represented by a plurality of bits, the range coder may encode or decode bit-by-bit based on the context values of the contexts associated to that bit. As one example, based on the context values of the contexts associated with a bit, the range coder may determine the probability value, and use the probability value to update the low and range values, and also update the probability value in some examples.

In context-based range coding, the range coder may retrieve the probability value from probability values stored as a multi-dimensional table in on-chip memory. The on-chip memory may be memory that is on the chip that includes the range coder, and may be shared by various components of the chip. In some examples, the probability values may be stored in on-chip memory of the chip that includes the range coder.

The range coder may determine an index into a table, possibly a multi-dimensional table, stored in the on-chip memory to determine a probability value for a coding a particular bit. The probability value may be indicative of the range for that bit. The range coder may determine the index into the table based on context values of different contexts such as a current offset relative to a dictionary (or history) position, a previous symbol, etc. As an example, the table may be a two-dimensional table, where a first dimension (e.g., vertical or horizontal in the two-dimensional table) corresponds to a first context (e.g., current state) and a second dimension (e.g., other one of the vertical or horizontal in the two-dimensional table) corresponds a second context (e.g., current offset).

The range coder reads the probability value and updates the range and low values in the range and low registers based on the read probability value. In some examples, the range coder may update the probability value because additional information is available indicating the likelihood of that symbol or group of symbols in the payload. For example, if the range coder is encoding or decoding a particular symbol, the range coder may update information indicating the frequency of the particular symbol, as well as the likelihood that the particular symbol follows another symbol. The range coder may write the updated probability value back into memory identified by the determined index. The range coder may perform such operations bit-by-bit.

One potential technical problem that may exist is that the range coder performs a read operation to read a probability value from the on-chip memory for each bit in a plurality of bits. Therefore, for every read from the on-chip memory, the range coder may utilize clock cycles to complete the read operation and utilize memory bus bandwidth by retrieving the probability value.

For example, for a first bit of a plurality of bits to be coded (e.g., encoded or decoded), the range coder determines the context values for the plurality of contexts. Based on the context values of the plurality of contexts, the range coder determines an index into the multi-dimensional table of probability values, retrieves the probability value, and updates the low and range values in respective low and range registers. If needed, the range coder, or possibly some other processing circuitry, updates the probability value and restores the probability value in the table of probability values. The range coder then repeats these operations for the second bit of the plurality of bits, and so forth. Accordingly, for each bit in the plurality of bits, the range coder needs to access the on-chip memory, which may be processing and bandwidth intensive.

In one or more examples described in this disclosure, rather than retrieve probability values on a bit-by-bit basis, the range coder may retrieve, in response to a single instruction to access the on-chip memory, speculative read probability values (also referred to as speculative probability values) for the plurality of bits. The range coder may store the speculative probability values in its internal memory that is dedicated to the range coder or fewer circuit components as compared to the on-chip memory that stores the probability table. The range coder accesses the speculative probability values stored in its local memory to determine the actual probability value for each bit, rather than accessing the probability values stored in the on-chip memory.

The speculative probability values are referred to as "speculative" because not all speculative probability values may be actual probability values (e.g., not all speculatively read probability values will be used during encoding or decoding). For example, the range coder retrieves all possible probability values for the bits in the plurality of bits. Hence, speculative probability values refer to possible probability values for the bits in a plurality of bits, but the actual probability value to be used for a bit may not be known until that bit is to be coded. Accordingly, the probability values are not speculative in that the values may be different. Rather, the probability values that are read are speculative in that some of the probability values are actually used for coding purposes and others are not. However, which probability values are used and which probability values are not used may not be known until the actual coding of a bit.

In some examples, the range coder is configured to retrieve a plurality of speculative probability values for a plurality of bits using a single read instruction to the on-chip memory if the context value for at least one of the contexts for the plurality of bits is the same. For instance, the entire table of probability values may be too large to store in the local memory of the range coder. However, the number of probability values associated with only a particular context value of a context may be small enough that the probability values associated with the context value of the context can be stored in the local memory of the range coder. Accordingly, if a context value for a context is going to be the same for a plurality of bits, the range coder may retrieve the probability values associated with that context value for the context and store the probability values, which are speculative probability values, in its local memory.

In this disclosure, speculative probability values should not be confused to mean that the probability values are speculative. Rather, speculative probability values mean that multiple values are read speculatively. For example, not all of the speculative probability values will be used for encoding or decoding, but the probability values are read speculatively because one or more of these probability values will be used, and other will not.

In the above example where a context value for a context is the same for a plurality of bits, and the range coder retrieves the speculative probability values associated with that context value for the context and store the probability values, the locally stored probability values are possible probability values for all of the bits in the plurality of bits. Then, on a bit-by-bit basis, based on factors such as context values for any other context needed to determine the probability value, the range coder may determine the probability value from the locally stored probability values.

As an illustrative example, assume that the current state context (e.g., the state context is based on the classification of previously coded symbols) for a plurality of bits is the same, and is a first context value. The on-chip memory may store all probability values associated with the current state context being the first context value. In this example, the range coder may retrieve all of the probability values associated with the current state context being the first context value in response to a single read instruction to read from the table of probability values stored in on-chip memory. The probability values retrieved with the single read instruction are speculative probability values because not all of the retrieved probability values will be the actual probability values for the bits of the plurality of bits, but the actual probability value of each of the bits of the plurality of bits will be one of the probability values in the speculative probability values. Then for each bit in the plurality of bits, the range coder may determine the probability value (e.g., which sets the range value for range coding) from the retrieved speculative probability values based on respective context values for the other contexts for each of the bits. In this way, the number of accesses to the on-chip memory may be reduced because the on-chip memory is accessed a single time to retrieve probability values for a plurality of bits, rather than accessing the on-chip memory for each bit of the plurality of bits to retrieve probability values on a bit-by-bit basis.

In some examples, to allow the range coder to retrieve speculative probability values with a single read instruction, the table of probability values may be arranged in a specific manner. For example, the context value of a first context that is the same for each bit of the plurality of bits forms an index to a row or column of the table of probability values. The row or column of the table of probability values stores probability values for all context values of a second context. In some examples, the context values of a second context may be different for the bits of the plurality of bits.

For instance, assume that for each bit of the plurality of bits, the context value for the first context is 5. In this example, the range coder may access row 5 of the table of probability values, and retrieve all potential probability values (i.e., speculative probability values) stored in the row of the table of probability values indexed by the value of 5. As an example, the first probability value in the row having index 5 may be associated with the second context having a first value, the second probability value in the row having index 5 may be associated with the second context having a second value, the third probability value in the row having index 5 may be associated with the second context having a third value, the fourth probability value in the row having index 5 may be associated with the second context having a fourth value, and so forth.

Each of the entries in the row or column indexed by a context value of the first context may be stored in separate memory locations within the on-chip memory. In some examples, one way to access all of the memory locations within a row or column of the on-chip memory is that the memory locations are arranged as contiguous physical memory locations. The contiguous physical memory locations may be arranged in banks of memory locations.

In the example of FIG. 1, each access node 17 provides connectivity to switch fabric 14 for a different group of servers 12 and may be assigned respective IP addresses and provide routing operations for the servers 12 coupled thereto. Access nodes 17 may interface with and utilize switch fabric 14 so as to provide full mesh (any-to-any) interconnectivity such that any of servers 12 may communicate packet data for a given packet flow to any other of the servers using any of a number of parallel data paths within the data center 10. In addition, access nodes 17 described herein may provide additional services, such as storage (e.g., integration of solid-state storage devices), security (e.g., encryption), acceleration (e.g., compression), I/O offloading, and the like. In some examples, one or more of access nodes 17 may include storage devices, such as high-speed solid-state drives or rotating hard drives, configured to provide network accessible storage for use by applications executing on the servers. More details on the example data center network architecture and interconnected access nodes illustrated in FIG. 1 are available in U.S. patent application Ser. No. 15/939,227, filed Mar. 28, 2018, entitled "Non-Blocking Any-to-Any Data Center Network with Packet Spraying Over Multiple Alternate Data Paths,", the entire content of which is incorporated herein by reference.

Various example architectures of access nodes 17 are described below with respect to FIGS. 2, 3, and 4. With respect to the examples, the architecture of each access node 17 comprises a multiple core processor system that represents a high performance, hyper-converged network, storage, and data processor and input/output hub. The architecture of each access node 17 is optimized for high performance and high efficiency stream processing. For example, by retrieving speculative probability values for a plurality of bits with one single read instruction of the memory, the example techniques may reduce memory bandwidth and speed up the range coding (encoding or decoding) of symbols. Furthermore, by compressing state information as part of switching data stream processing, the example techniques may promote coding efficiencies while allowing non-sequential processing of multiple data streams.

In general, a stream, also referred to as a data stream, may be viewed as an ordered, unidirectional sequence of computational objects that can be of unbounded or undetermined length. In a simple example, a data stream originates in a producer and terminates at a consumer, is operated on sequentially, and is flow-controlled. In some examples, a data stream can be defined as a sequence of stream fragments, each representing a portion of data communicated by a data stream. In one example, a stream fragment may include a memory block contiguously addressable in physical address space, an offset into that block, and a valid length. Data streams can be discrete, such as a sequence of packets received from a network, or continuous, such as a stream of blocks, words or bytes read from a storage device. A data stream of one type may be transformed into another type as a result of processing. Independent of the data stream type, data stream manipulation requires efficient fragment manipulation. An application executing on one of access nodes 17 may operate on a data stream in three example broad ways: the first is protocol processing, which includes operating on control information or headers within the stream; the second is payload processing, which involves significant accessing of the data within the stream; and third is some combination of both control and data access.

Data stream processing is a specialized type of conventional general-purpose processing supporting specialized limitations with regard to both access and directionality. Processing typically only accesses a limited portion of the stream at any time, called a "window," within which it may perform random accesses. Objects outside of the window are not accessible through a streaming interface. In contrast, general purpose processing views the whole memory as randomly accessible at any time. In addition, data stream processing generally progresses in one direction, called the forward direction. These characteristics make data stream processing amenable to pipelining, as different processors within one of access nodes 17 can safely access different windows within the stream.

As described herein, data processing units of access nodes 17 may process data stream information by managing "work units." In general, a work unit (WU) is a container that is associated with a stream state and used to describe (i.e. point to) data within a stream (stored in memory) along with any associated meta-data and operations to be performed on the data. In the example of FIG. 1, data streams of data units may dynamically originate within a peripheral unit of one of access nodes 17 (e.g. injected by a networking unit, a host unit, or a solid state drive interface), or within a processor of the one of access nodes 17, in association with one or more data streams of data, and terminate at another peripheral unit or another processor of the one of access nodes 17. Each work unit maintained by a data processing unit is associated with an amount of work that is relevant to the entity executing the work unit for processing a respective portion of a data stream.

Data stream processing is typically initiated as a result of receiving one or more data units associated with respective portions of the data stream and constructing and managing work units for processing respective portions of the data stream. In protocol processing, a portion would be a single buffer (e.g. packet), for example. Within access nodes 17, work units may be executed by processor cores, hardware blocks, I/O interfaces, or other computational processing units. For instance, a processor core of an access node 17 executes a work unit by accessing the respective portion of the data stream from memory and performing one or more computations in accordance with the work unit. A component of the one of access nodes 17 may receive, execute or generate work units. A succession of work units may define how the access node processes a flow, and smaller flows may be stitched together to form larger flows.

As described above, the range coder encodes or decodes symbols, and these symbols may be generated by execution of an application. In some examples, the range coder receives a data stream of packets, containing symbols, from execution of one application. However, this may not always be the case. In various examples, the range coder receives a first data stream of one or more packets, containing symbols, from execution of a first application, and, in parallel, receives a second data stream of one or more packets, containing symbols, from execution of a second application. In such cases, the range coder may dynamically switch its coding operations between the first and second data streams. For instance, the range coder may code packets from the first data stream, and then switch to coding packets from the second data stream, and then return back to coding packets from the first data stream, and so forth. Accordingly, rather than sequentially processing to completion each data stream, which can delay the amount of time before a data stream is processed, the range coder switches between data streams to provide a piecemeal coding process.

In general, there may be various reasons to switch processing. As one example, the data to process for a particular data stream has not arrived yet from source, therefore, it may be beneficial to switch to processing another data stream, rather than pausing and waiting for data for the data stream that was being processed. As another example, one data stream may be taking over full bandwidth, and not allowing the process of any other data stream. By switching, each stream is given a time quantum.

As part of coding packets, of a first application, in a first data stream, the range coder generates state information including the table of probability values and the range and low values. For instance, the range coder constructs a table of probability values and initializes the table of probability values with default values. Then, as the range coder starts coding packets, the range coder updates the table of probability values based on the coding of the symbols.

When the range coder switches coding packets of the first application to coding packets of the second application, the table of probability values that the range coder generated for the first application is not usable for coding packets of the second application. For instance, the probability distribution of symbols in the packets of the second application may be substantially different than the probability distribution of symbols in the packets of the first application. Therefore, the context values may be different. Moreover, streams should not be mixed, as they belong to different applications, subject, users, etc., and therefore, the context values for the stream to which the range coder is switching should be kept separate. Accordingly, for coding packets of the second application, similar to packets of the first application, the range coder may generate a table of probability values for the coding packets of the second application.

In one or more examples, when the range coder switches back from coding packets of the second application to coding packets of the first application, there may be technical advantages for the range coder to access the state information that the range coder generated prior to switching (e.g., the state that was saved earlier when range coder switched from first application to second application). The table of probability values that the range coder generated for the first application as part of coding the packets prior to switching are likely to be indicative of the probability distribution of symbols in future packets. Accordingly, while there may be updates to the table of probability values, the range coder would not need to regenerate the table of probability values anew.

By having access to the state information that the range coder generated prior to switching, the coding efficiency of the range coder may increase, as compared to if the access to the state information as unavailable. As an example, the range coder may keep coding packets of the first application, after switching back to the first application, based on the previously calculated range and low values, rather than redetermining range and low values.

To understand another way, optimal range coding may be achieved if the range coder does not need to switch between applications because the range coder does not need to restart the generation of a table of probability values or redetermine range and low values. However, the DPU may receive data streams from different applications in parallel, necessitating the range coder to switch coding between data streams. Accordingly, there may be advantages with coding efficiency if the range coder is able to store the state information (e.g., table of probability values, range and low values, etc.) that the range coder generated during the coding of packets of an application so that the range coder can retrieve the state information and restore the range coding process when switching back to processing packets of the application.

There may be technical problems associated with such store and retrieve of state information. For instance, the state information may be substantial in data size. Also, the on-chip memory may not be sufficient in size to store the state information for multiple different applications. Accordingly, the state information would need to be stored in external memory. However, transferring all of the data of the state information to the external memory at a data stream switch, and then retrieving all of the data of the state information from the external memory at a data stream switch back may substantially slow down the coding process. For instance, there may be substantial delay, while the range coder remains idle, for storing the state information to the external memory or for retrieving the state information from the external memory.

In one or more example techniques described in this disclosure, to overcome or minimize the potential coding delays associated with storing state information to and retrieving state information from the external memory, one or more processing circuits may be configured to compress the state information prior to storing the state information in the external memory and decompress the state information after retrieving the state information. By compressing the state information prior to storage, the amount of data that needs to be stored is reduced, thereby reducing the amount of time needed to store the state information and the amount of time needed to retrieve the state information.

To further ensure that the coding delay is minimized when storing and retrieving state information, the processing circuits may be configured to perform compression and decompression techniques that require minimal compression and decompression time. For instance, the processing circuits may be configured to perform relatively low complex compression and decompression techniques. As one example, to compress the state information, the processing circuits may only store values in the table of probability values that are not default values (e.g., only store values that changed) and store information indicating the location of these non-default values in the table of probability values. The processing circuits may further store a bitmask that indicates which rows or columns of the table of probability values had values that were stored to further speed the initializing process of the range coding when switching back to a data stream. Run-length coding may be another example way of compressing the state information that is a relatively fast, low complex compression and decompression technique.

For purposes of example, DPUs of or within each access node 17 may execute an operating system, such as a general-purpose operating system or a special-purpose operating system, that provides an execution environment for data plane software for data processing. Moreover, each DPU may be configured to utilize a work unit (WU) stack data structure (referred to as a 'WU stack' in a multiple core processor system. As described herein, the WU stack data structure may provide certain technical benefits, such as helping manage an event driven, run-to-completion programming model of an operating system executed by the multiple core processor system. The WU stack, in a basic form, may be viewed as a stack of continuation WUs used in addition to (not instead of) a program stack maintained by the operating system as an efficient means of enabling program execution to dynamically move between cores of the access node while performing high-rate stream processing. As described below, a WU data structure is a building block in the WU stack and can readily be used to compose a processing pipeline and services execution in a multiple core processor system. The WU stack structure carries state, memory, and other information in auxiliary variables external to the program stack for any given processor core. In some implementations, the WU stack may also provide an exception model for handling abnormal events and a 'success bypass' to shortcut a long series of operations. Further, the WU stack may be used as an arbitrary flow execution model for any combination of pipelined or parallel processing.

As described herein, access nodes 17 may process WUs through a plurality of processor cores arranged as processing pipelines within access nodes 17, and such processing cores may employ techniques to encourage efficient processing of such work units and high utilization of processing resources. For instance, a processing core (or a processing unit within a core) may, in connection with processing a series of work units, access data and cache the data into a plurality of segments of a level 1 cache associated with the processing core. The level 1 cache is one example of on-chip memory. In some examples, a processing core may process a work unit and cache data from non-coherent memory in a segment of the level 1 cache. The processing core may also concurrently prefetch data associated with a work unit expected to be processed in the future into another segment of the level 1 cache associated with the processing core. By prefetching the data associated with the future work unit in advance of the work unit being dequeued from a work unit queue for execution by the core, the processing core may be able to efficiently and quickly process a work unit once the work unit is dequeued and execution of the work unit is to commence by the processing core. More details on work units and stream processing by data processing units of access nodes are available in U.S. Provisional Patent Application No. 62/589,427, filed Nov. 21, 2017, entitled "Work Unit Stack Data Structures in Multiple Core Processor System," and U.S. Provisional Patent Application No. 62/625,518, entitled "EFFICIENT WORK UNIT PROCESSING IN A MULTICORE SYSTEM", filed Feb. 2, 2018, the entire contents of both being incorporated herein by reference.

As described herein, the data processing units for access nodes 17 includes one or more specialized hardware-based accelerators configured to perform acceleration for various data-processing functions, thereby offloading tasks from the processing units when processing work units. That is, each accelerator is programmable by the processing cores, and one or more accelerators may be logically chained together to operate on stream data units, such as by providing cryptographic functions, compression and regular expression (RegEx) processing, data storage functions and networking operations.

A data compression/decompression accelerator unit of a data processing unit may include a hardware pipeline for performing history/dictionary-based compression. The disclosed history/dictionary-based compression hardware pipeline, referred to herein as a "search block," is configured to perform string search and replacement functions to compress an input data file. In some examples, the search block performs a first stage of a two-stage compression process performed by the data compression/decompression accelerator unit. The second stage of the compression/decompression process includes entropy coding, which may be performed using either a prefix-free, variable length coding block, such as a Huffman coding block, or a Range coding block. For decompression, a first stage of a two-stage decompression process performed by the data compression/decompression accelerator unit includes entropy decoding or Range decoding, and a second stage includes history/dictionary-based decompression. One or more examples are described with respect to the compression/decompression process of the data compression/decompression accelerator unit, such as range encoding and decoding performed by a range coder circuit of the data compression/decompression accelerator unit.

Part of the first stage of the two-stage compression process includes determining literals, and length-distance pairs in an input data file. Literals directly represent the original data (i.e., string of bytes), and the length-distance pairs are pointers to previous occurrences of a string of bytes within a sliding history window. The length-distance pairs may include a length value and a distance value. The second stage of the two-stage compression includes converting the literal, length, and distance values into codewords, such as via entropy encoding techniques.

As described above, for range coding, a range coder determines range and low values for each bit of a plurality of bits used to represent a symbol. The range value may be based on a probability value stored in a table of probability values. To determine the probability value, the range coder determines context values for a plurality of contexts, and based on the context values, the range coder is able to identify the memory location in on-chip memory where the probability value for each bit is stored.

However, rather than accessing the memory on a bit-by-bit basis, there may be instances where the range coder is able to retrieve a group of probability values with a single read instruction to the memory (e.g., prefetch a batch of probability values). The group of probability values, called speculative probability values, include probability values for coding all bits within a plurality of bits used to represent a symbol.

The table of probability values that is stored in on-chip memory (e.g., level 1 cache) may require more memory space than is available to store with local memory (e.g., a register) of the range coder. This is because there are a plurality of contexts for coding each bit, and therefore many context combinations, resulting in a relatively large table of probability values. As an example, assume that there are three contexts for coding a particular bit. Assume that there are 12 possible context values for a first context, 16 possible context values for a second context, and 2 context values for a third context. In this example, there are a total of 12*16*2=384 possible probability values. Storing all 384 possible probability values in a local memory, as well as information indicating the permutations of the three contexts for each of the 384 possible probability values may be too much information for the local memory of the range coder to store.

However, if one or more context values for one or more contexts are the same for a plurality of bits, then there may be sufficient reduction in the number of probability values that all possible probability values (e.g., speculative probability values) for the bits in the plurality of bits can be stored locally. For example, assume that the context value for the first context of the above example is the same for the plurality of bits. In this example, the total number of probability values for coding the plurality of bits is 16*2=32 possible probability values (again, because the context value for the first context is the same for the bits). Storage of the 32 probability values, and the permutations of the second and third context values for each of the 32 probability values is significantly less than the 384 possible probability values where context value for one of the contexts is not known be the same.

In one or more examples, the range coder (or possibly some other circuitry), in response to a single read instruction to the on-chip memory, retrieves all of the probability values for coding a plurality of bits of a symbol in response to the determination that a context value for at least one of the contexts is the same for the plurality of bits. The range coder then accesses the retrieved probability values to determine the actual probability values for each of the bits of the plurality of bits, and codes the bits (e.g., determines range and low values) based on the determined probability values. Accessing the local memory may require fewer clock cycles and limit use of the bus to access the on-chip memory.

The on-chip memory may store the probability values in rows and columns, where a context value for one of the contexts is an index (e.g., identifies a row or column) into the table of probability values, and the indexed row or column stores all probability values for all context values for all other contexts. For example, if the context value for the first context is "A," then row or column A in the table of probability values stores all probability values for context values for the second and third contexts. Accordingly, with a single read of a row or column within the table of probability values, the range coder may retrieve all potential probability values for coding the plurality of bits used to represent a symbol. The range coder would retrieve more probability values than the actual probability values that will ultimately be used for coding the bits. However, all the actual probability values that will be used for coding the bits are going to be included in the retrieved probability values. In some examples, the memory locations that store the probability values in the on-chip memory are arranged as physically contiguous memory locations. Since not all probability values will be used, the retrieved probability values are speculative probability values.

The table of probability values, the range and low values, and other such values used to code symbols are examples of state information. The state information is generally different for different data streams because the probability distribution of the symbols is different. Accordingly, when the range coder switches data streams from a first data stream to a second data stream, the state information for a first application whose execution generated the first data stream may be lost. For instance, the DPU may simultaneously receive data streams from different applications (e.g., first data stream from first application and second data stream from second application).

One option would be for the DPU to process the first data stream to completion, and then start the processing of the second data stream. However, this option would result in delaying any output from the processing of the second data stream. Another option would be for the DPU to switch between processing the first data stream and the second data stream. For instance, the range coder of the DPU codes a first set of packets from the first data stream, then switches to coding a first set of packets from the from the second data stream, and then back to coding a second set of packets from the first data stream, and so forth. In this option, the state information generated after coding the first set of packets from the first data stream may be lost.

In examples where the range coder switches coding between data streams, processing circuitry, including possibly the range coder itself, may store the state information. Due to the relatively large amount of data of the state information, the processing circuitry may not be able to store the state information within the on-chip memory (e.g., level 1 cache), and may need to store to external memory. However, due to the relatively large amount of data of the state information, the time needed to store the state information, and time needed later to retrieve the state information may be substantial. In some cases, it is possible that delay in storing and retrieving the state information is as long as the amount of time the range coder is to spend coding packets from a data stream before switching.

In one or more examples, the range coder, or some other processing circuitry, may be configured to compress the state information prior to storing in external memory, and decompress the state information after retrieving from external memory. As an example, processing circuitry (e.g., the range coder, or some other processing circuitry alone or in combination with the range coder) may generate state information for context-based coding a first set of one or more packets of a first application (e.g., a first set of one or more packets from a first data stream). In this example, the processing circuitry may receive a command that indicates that the processing circuitry is to switch processing a data stream from the first application to processing a data stream from a second application. Accordingly, the processing circuitry may compress the state information for context-based coding the first packet to generate compressed state information, and store the compressed state information in memory.

Subsequent to storing the compressed state information, and prior to retrieving the compressed state information from memory, the processing circuitry may context-based code a first set of one or more packets of a second application. For instance, the range coder may generate state information for coding the first set of one or more packets of the second application, and context-based code the first set of one or more packets using the state information.

Assume that the processing circuitry received a command to switch back to processing the data stream from the first application. Accordingly, the processing circuitry may compress the state information for context-based coding the first set of one or more packets of the second application, and store the resulting compressed state information in memory.

The processing circuitry may retrieve the compressed state information from the memory for the first set of one or more packets of the first application, and decompress the compressed state information to reconstruct the state information. The range coder may context-based code a second set of one or more packets of the first application based on the reconstructed state information.

During the context-based coding of the second packet of the first application, the range coder may update the reconstructed state information (e.g., based on frequency of symbols in the second set of one or more packets, and updates to the range and low values) to generate state information for context-based coding the second set of one or more packets. If the processing circuitry receives a command to switch processing back to the second application, the processing circuitry may compress the state information for context-based coding the second set of one or more packets of the first application, and store the resulting compressed state information in memory for later retrieval when the processing circuitry switches processing back to the first application. For instance, after switching processing back to the first application, the processing circuitry may retrieve the compressed state information, decompress the state information to generate reconstructed state information, and start coding a third set of one or more packets of the first application.

There may be various ways in which the processing circuitry compresses the state information. For instance, the state information includes the table of probability values arranged as a plurality of row or columns. The processing circuitry may determine which rows or columns of the plurality of rows or columns of the table of probability values include non-default values, and retrieve values only from one of rows or columns of the plurality of rows or columns of the table of probability values that include non-default values. In this example, to store the compressed state information, the processing circuitry may store only the retrieved values of the table of probability values. The processing circuitry may also store information indicating locations within the table of probability values from which the values are retrieved.

To decompress, the processing circuitry may determine where the stored values belong in the table of probability values, and store the retrieved values in the determined locations. The processing circuitry may generate default values for all other locations within the table of probability values.

Additionally or alternatively, the processing circuitry may generate a bitmask that indicates which rows or columns of the table of probability values stores non-default values (e.g., which are values that are retrieved) as a faster way to initialize the table of probability values. For instance, the processing circuitry, as part of the decompression, may determine which rows or columns only included default values based on the bitmask. For the determined rows, the processing circuitry may generate default values. For the remaining rows, the processing circuitry may include retrieve values, and for locations within the table of probability values for which no value was retrieved, the processing circuitry may store a default value for those locations.

Other type of compression techniques are possible. For instance, the processing circuitry may perform run-length coding as a way to compress. The compression techniques may be used in combination with one another or separately. Furthermore, the example compression and decompression techniques described in this disclosure should not be considered limiting.

Figure 2:
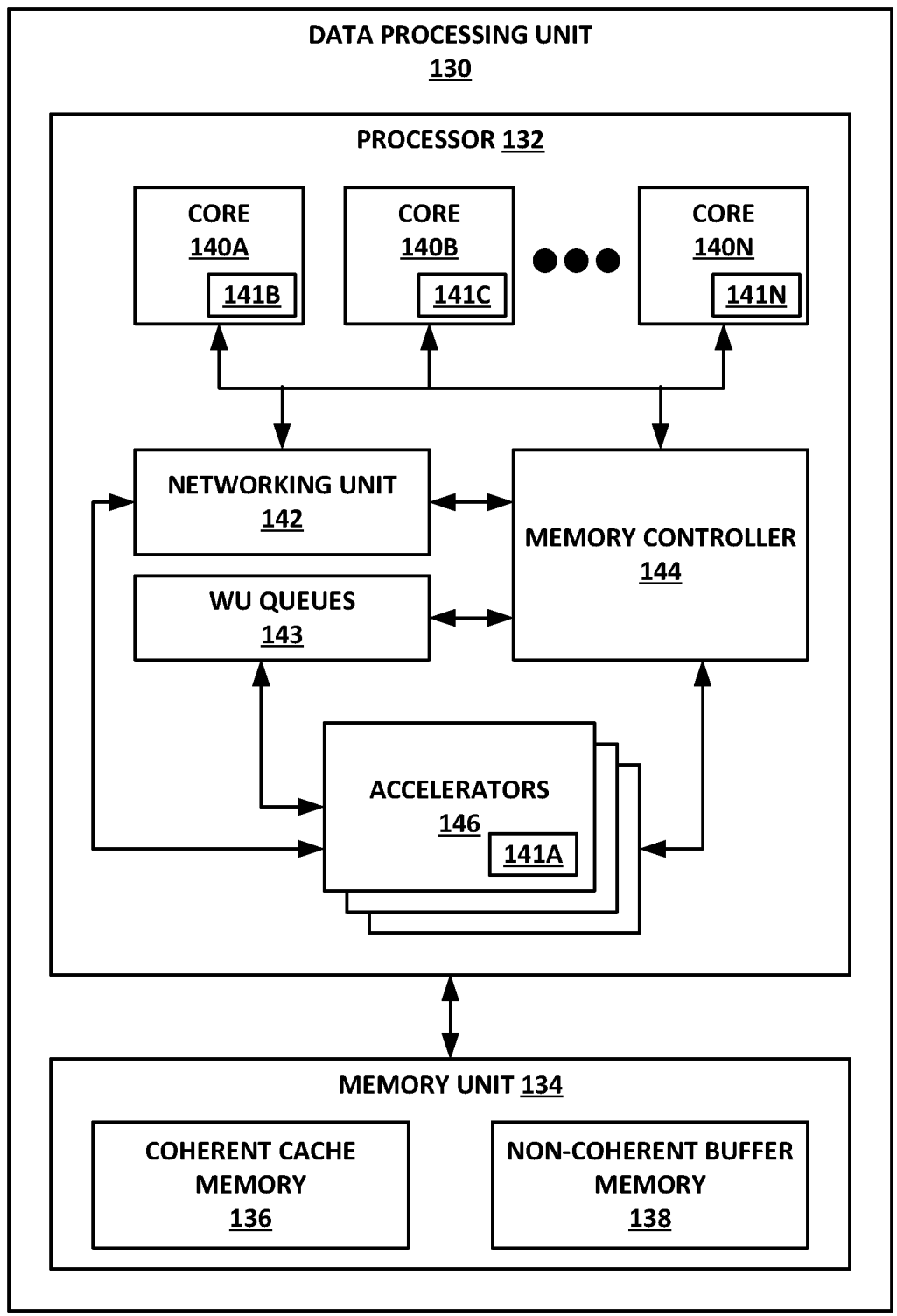
FIG. 2 is a block diagram illustrating an example data processing unit including two or more processing cores, in accordance with the techniques of this disclosure.

FIG. 2 is a block diagram illustrating an example data processing unit (DPU) 130 including two or more processing cores, in accordance with the techniques of this disclosure. DPU 130 generally represents a hardware chip implemented in digital logic circuitry and may be used in any computing or network device. DPU 130 may operate substantially similar to and generally represent any of access nodes 17 of FIG. 1. Thus, DPU 130 may be communicatively coupled to one or more network devices, server devices (e.g., servers 12), random access memory, storage media (e.g., solid state drives (SSDs)), a data center fabric (e.g., switch fabric 14), or the like, e.g., via PCI-e, Ethernet (wired or wireless), or other such communication media. Moreover, DPU 130 may be implemented as one or more application-specific integrated circuit (ASIC), may be configurable to operate as a component of a network appliance or may be integrated with other DPUs within a device.

In the illustrated example of FIG. 2, DPU 130 includes a multi-core processor 132 having a plurality of programmable processing cores 140A-140N ("cores 140") coupled to an on-chip memory unit 134. Each of cores 140 includes a level 1 cache 141 (level 1 caches 141a, 141b, and 141n are associated with cores 140a, 140b, and 140n, respectively).

Memory unit 134 may include two types of memory or memory devices, namely coherent cache memory 136 and non-coherent buffer memory 138. Processor 132 also includes a networking unit 142, work unit (WU) queues 143, a memory controller 144, and accelerators 146. As illustrated in FIG. 2, each of cores 140, networking unit 142, WU queues 143, memory controller 144, memory unit 134, and accelerators 146 are communicatively coupled to each other. In some examples, processor 132 of DPU 130 further includes one or more accelerators (not shown) configured to perform acceleration for various data-processing functions, such as look-ups, matrix multiplication, cryptography, compression, regular expressions, or the like.

In this example, DPU 130 represents a high performance, hyper-converged network, storage, and data processor and input/output hub. For example, networking unit 142 may be configured to receive one or more data packets from and transmit one or more data packets to one or more external devices, e.g., network devices. Networking unit 142 may perform network interface card functionality, packet switching, and the like, and may use large forwarding tables and offer programmability. Networking unit 142 may expose Ethernet ports for connectivity to a network, such as switch fabric 14 of FIG. 1. DPU 130 may also include one or more interfaces for connectivity to host devices (e.g., servers) and data storage devices, e.g., solid state drives (SSDs) via PCIe lanes. DPU 130 may further include one or more high bandwidth interfaces for connectivity to off-chip external memory.

Processor 132 further includes accelerators 146 configured to perform acceleration for various data-processing functions, such as look-ups, matrix multiplication, cryptography, compression, regular expressions, or the like. For example, accelerators 146 may comprise hardware implementations of look-up engines, matrix multipliers, cryptographic engines, compression engines, or the like. In accordance with the techniques of this disclosure, at least one of accelerators 146 represents a hardware implementation of a data decompression engine. In particular, according to the techniques of this disclosure, accelerators 146 include a range encoder/decoder configured to retrieve speculative probability values for a plurality of bits in response to a single instruction to memory (e.g., memory unit 134), and use the retrieved speculative probability values to code bits. The range encoder/decoder of accelerators 146 may store retrieved speculative probability values in level 1 cache 141A or registers. Level 1 cache 141A and registers are examples of local memory. Such retrieval of speculative probability values may limit access to memory shared by various components (e.g., limit access to memory unit 134), which promotes bus bandwidth and reduces clock cycles needed to complete the coding operation.

In this example, memory unit 134 is configured to store the table of probability values that accelerators 146 utilize. In some examples, in response to switching the processing of data streams, one of cores 140 or accelerators 146 (alone or in combination), may compress the table of probability values stored in memory unit 134, and store the compressed values in an external memory (e.g., external to DPU 130). Cores 140 or accelerators 146 may retrieve a previously compressed probability values used for processing of data stream to which accelerators 146 are switching. Cores 140 or accelerators 146 may decompress the probability values and regenerate a table of probability values for coding the packets from the switched to data stream. Cores 140 and accelerators 146 may switch back and forth between a plurality of data streams, and compress and decompress tables of probability values as part of the switching to perform seamless coding of the data streams from the different data streams.

Memory controller 144 may control access to on-chip memory unit 134 by cores 140, networking unit 142, and any number of external devices, e.g., network devices, servers, external storage devices, or the like. Memory controller 144 may be configured to perform a number of operations to perform memory management. For example, memory controller 144 may be capable of mapping accesses from one of the cores 140 to either of coherent cache memory 136 or non-coherent buffer memory 138. More details on the bifurcated memory system included in the DPU are available in U.S. Provisional Patent Application No. 62/483,844, filed Apr. 10, 2017, and U.S. patent application Ser. No. 15/949,892, filed Apr. 10, 2018, and titled "Relay Consistent Memory Management in a Multiple Processor System," the entire content of each of which is incorporated herein by reference.

Cores 140 may comprise one or more microprocessors without interlocked pipeline stages (MIPS) cores, advanced reduced instruction set computing (RISC) machine (ARM) cores, performance optimization with enhanced RISC—performance computing (PowerPC) cores, RISC Five (RISC-V) cores, or complex instruction set computing (CISC or x86) cores. Each of cores 140 may be programmed to process one or more events or activities related to a given data packet such as, for example, a networking packet or a storage packet. Each of cores 140 may be programmable using a high-level programming language, e.g., C, C++, or the like.

Each of level 1 caches 141 may include a plurality of cache lines logically or physically divided into cache segments. Each of level 1 caches 141 may be controlled by a load/store unit also included within the core. The load/store unit may include logic for loading data into cache segments and/or cache lines from non-coherent buffer memory 138 and/or memory external to DPU 130. The load/store unit may also include logic for flushing cache segments and/or cache lines to non-coherent buffer memory 138 and/or memory external to DPU 130. In some examples, the load/store unit may be configured to prefetch data from main memory during or after a cache segment or cache line is flushed.

Processor cores 140 may be arranged as processing pipelines, and such processing cores may employ techniques to encourage efficient processing of such work units and high utilization of processing resources. For instance, any of processing cores 140 (or a processing unit within a core) may, in connection with processing a series of work units retrieved from WU queues 143, access data and cache the data into a plurality of segments of level 1 cache 141 associated with the processing core. In some examples, a processing core 140 may process a work unit and cache data from non-coherent memory 138 in a segment of the level 1 cache 141. As described herein, concurrent with execution of work units by cores 140, a load store unit of memory controller 144 may be configured to prefetch, from non-coherent memory 138, data associated with work units within WU queues 143 that are expected to be processed in the future, e.g., the WUs now at the top of the WU queues and next in line to be processed. For each core 140, the load store unit of memory controller 144 may store the prefetched data associated with the WU to be processed by the core into a standby segment of the level 1 cache 141 associated with the processing core 140.

In some examples, the plurality of cores 140 executes instructions for processing a plurality of events related to each data packet of one or more data packets, received by networking unit 142, in a sequential manner in accordance with one or more work units associated with the data packets. As described above, work units are sets of data exchanged between cores 140 and networking unit 142 where each work unit may represent one or more of the events related to a given data packet.

As one example use case, stream processing may be divided into work units executed at a number of intermediate processors between source and destination. Depending on the amount of work to be performed at each stage, the number and type of intermediate processors that are involved may vary. In processing a plurality of events related to each data packet, a first one of the plurality of cores 140, e.g., core 140A may process a first event of the plurality of events. Moreover, first core 140A may provide to a second one of plurality of cores 140, e.g., core 140B a first work unit of the one or more work units. Furthermore, second core 140B may process a second event of the plurality of events in response to receiving the first work unit from first core 140B.

As another example use case, transfer of ownership of a memory buffer between processing cores may be mediated by a work unit message delivered to one or more of processing cores 140. For example, the work unit message may be a four-word message including a pointer to a memory buffer. The first word may be a header containing information necessary for message delivery and information used for work unit execution, such as a pointer to a function for execution by a specified one of processing cores 140. Other words in the work unit message may contain parameters to be passed to the function call, such as pointers to data in memory, parameter values, or other information used in executing the work unit.

In one example, receiving a work unit is signaled by receiving a message in a work unit receive queue (e.g., one of WU queues 143). The one of WU queues 143 is associated with a processing element, such as one of cores 140, and is addressable in the header of the work unit message. One of cores 140 may generate a work unit message by executing stored instructions to addresses mapped to a work unit transmit queue (e.g., another one of WU queues 143). The stored instructions write the contents of the message to the queue. The release of a work unit message may be interlocked with (gated by) flushing of the core's dirty cache data and in some examples, prefetching into the cache of data associated with another work unit for future processing.

Figure 3:
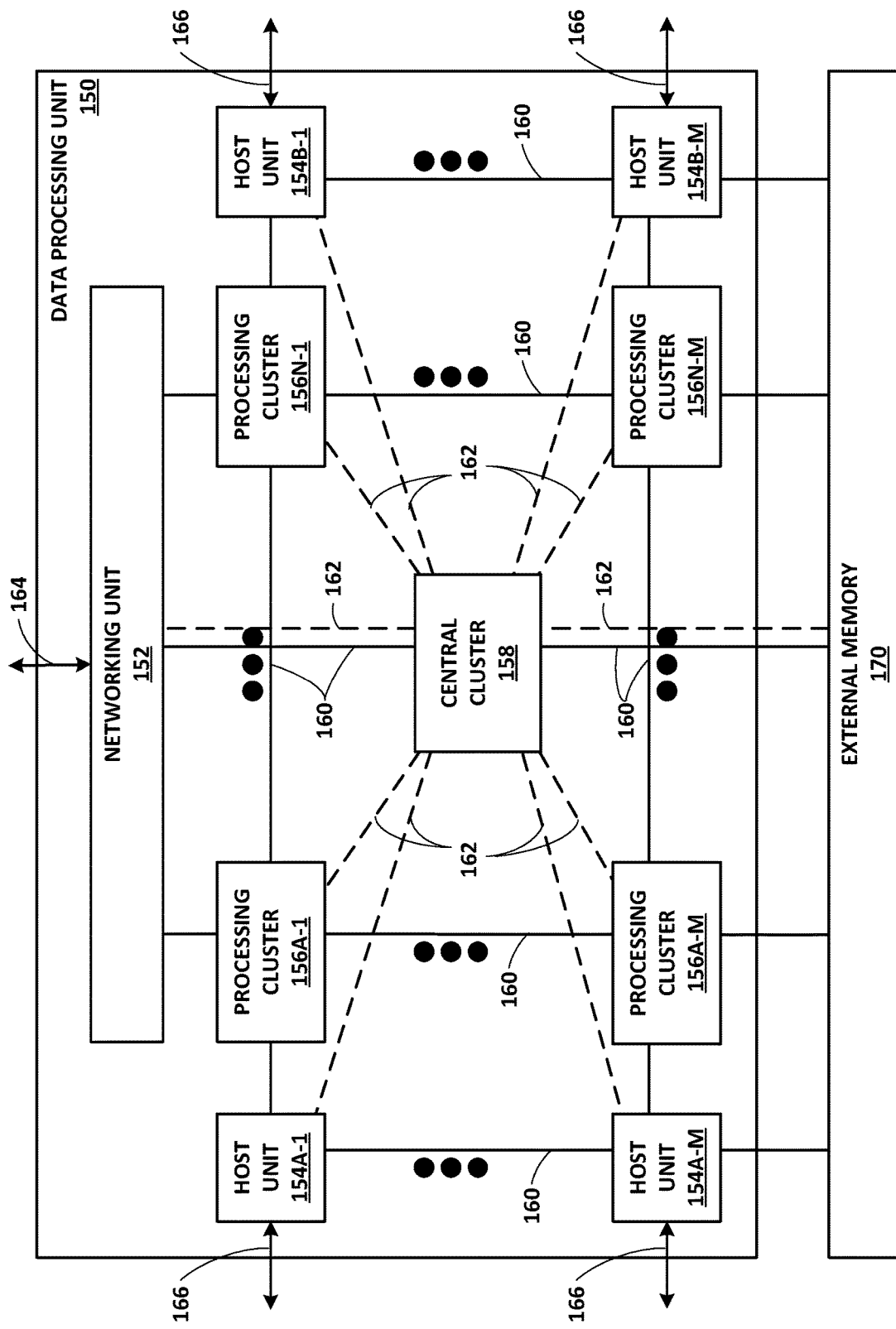
FIG. 3 is a block diagram illustrating another example data processing unit including two or more processing clusters, in accordance with the techniques of this disclosure.

FIG. 3 is a block diagram illustrating another example of a DPU 150 including two or more processing clusters, in accordance with the techniques of this disclosure. DPU 150 may operate substantially similar to any of the access nodes 17 of FIG. 1. Thus, DPU 150 may be communicatively coupled to a data center fabric (e.g., switch fabric 14), one or more server devices (e.g., servers 12), storage media (e.g., SSDs), one or more network devices, random access memory, or the like, e.g., via PCI-e, Ethernet (wired or wireless), or other such communication media in order to interconnect each of these various elements. DPU 150 generally represents a hardware chip implemented in digital logic circuitry. As various examples, DPU 150 may be provided as an integrated circuit mounted on a motherboard of a computing, networking and/or storage device or installed on a card connected to the motherboard of the device.

In general, DPU 150 represents a high performance, hyper-converged network, storage, and data processor and input/output hub. As illustrated in FIG. 3, DPU 150 includes networking unit 152, processing clusters 156A-1 to 156N-M (processing clusters 156), host units 154A-1 to 154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM) or dynamic random access memory (DRAM).

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of DPU 150, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSD devices. This allows DPU 150 to operate as an endpoint or as a root. For example, DPU 150 may connect to a host system (e.g., a server) as an endpoint device, and DPU 150 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

DPU 150 provides optimizations for stream processing. DPU 150 executes an operating system that facilitates run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In one example, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

DPU 150 operates on work units (WUs) that associate a buffer with an instruction stream to reduce dispatching overhead and allow processing by reference to minimize data movement and copy. The stream-processing model may structure access by multiple processors (e.g., processing clusters 156) to the same data and resources, avoid simultaneous sharing, and therefore, reduce contention. A processor may relinquish control of data referenced by a work unit as the work unit is passed to the next processor in line. Central cluster 158 may include a central dispatch unit responsible for work unit queuing and flow control, work unit and completion notification dispatch, and load balancing and processor selection from among processing cores of processing clusters 156 and/or central cluster 158.

As described above, work units are sets of data exchanged between processing clusters 156, networking unit 152, host units 154, central cluster 158, and external memory 170. Each work unit may be represented by a fixed length data structure, or message, including an action value and one or more arguments. In one example, a work unit message includes four words, a first word having a value representing an action value and three additional words each representing an argument. The action value may be considered a work unit message header containing information necessary for message delivery and information used for work unit execution, such as a work unit handler identifier, and source and destination identifiers of the work unit. The other arguments of the work unit data structure may include a frame argument having a value acting as a pointer to a continuation work unit to invoke a subsequent work unit handler, a flow argument having a value acting as a pointer to state that is relevant to the work unit handler, and a packet argument having a value acting as a packet pointer for packet and/or block processing handlers.

In some examples, one or more processing cores of processing clusters 180 may be configured to execute program instructions using a work unit (WU) stack. In general, a work unit (WU) stack is a data structure to help manage event driven, run-to-completion programming model of an operating system typically executed by processing clusters 156 of DPU 150, as further described in U.S. Patent Application Ser. No. 62/589,427, filed Nov. 21, 2017, the entire content of which is incorporated herein by reference.

In some example implementations, load store units within processing clusters 156 may, concurrent with execution of work units by cores within the processing clusters, identify work units that are enqueued in WU queues for future processing by the cores. In some examples, WU queues storing work units enqueued for processing by the cores within processing clusters 156 may be maintained as hardware queues centrally managed by central cluster 158. In such examples, load store units may interact with central cluster 158 to identify future work units to be executed by the cores within the processing clusters. The load store units prefetch, from the non-coherent memory portion of external memory 170, data associated with the future work units. For each core within processing clusters 156, the load store units of the core may store the prefetched data associated with the WU to be processed by the core into a standby segment of the level 1 cache associated with the processing core.

DPU 150 may include one or more accelerators for performing range encoding/decoding of a data stream received and stored in memory of DPU 150. As described in more detail, the accelerators of DPU 150 include a range coder configured to perform range encoding/decoding techniques. As described above, in range coding, the range coder may determine a range value. The range value is based on how often (e.g., probability) certain bit combinations occur in the data stream. In some examples, various contexts may be indicative of the probability of a particular bit combination.

Context based coding utilizes contexts to determine the probability values for range encoding or decoding bits used to represent a symbol. For example, a context, such as previously coded values, can be indicative of the likelihood of a next bit being a one or zero. It should be understood that the contexts may indicate a likelihood of a particular bit being a one or zero, but the actual bit value may be different. However, on average, using information indicative of the likelihood of a bit being a particular value can reduce the amount of bits in a data stream.

In some examples, external memory 170 may be configured to store probability values corresponding to different combinations of context values. In some examples, external memory 170 may store compressed probability values, and more generally, state information needed to code packets from different data streams.

DPU 150 may retrieve the compressed state information and decompress the compressed state information to reconstruct the state information. DPU 150 may store the decompressed state information in its memory (e.g., memory unit 134 of FIG. 2), and access the decompressed state information for coding.

For example, the reconstructed state information may include a reconstructed table of probability values. The table of probability value may include a probability value for a first context having a first value, a second context having a first value, and a third context having a first value. The table of probability values may store a probability value for a first context having a second value, a second context having a first value, and a third context having a first value, and so forth for the different possible context values for the first, second, and third contexts. Because the number of combinations of different context values may be relatively large, the amount of memory needed to store the probability values may be relatively large. Hence, on-chip memory becomes a suitable memory to store the table of probability values. However, for DPU 150 to repeatedly access the on-chip memory may impact processing time because the on-chip memory is shared by various circuitry and clock cycles may be wasted while the various circuits are serviced and DPU 150 waits to retrieve probability values.

In some examples, the context value for at least one of the contexts may be the same for a plurality of bits that represent a symbol. If the context value for one of the contexts is the same, the total number of combinations of context values drops substantially. Local memory of DPU 150 (e.g., level 1 cache 141A of FIG. 2) may be large enough to store all probability values associated with a particular context value of one context. Accordingly, if DPU 150 determines that a context value for a context is the same for a plurality of bits, DPU 150 may retrieve all of the probability values associated with the context value of the context in response to a single read instruction to read from memory unit 134 (FIG. 2) (e.g., a read instruction issued by one of cores 140 of FIG. 2, accelerators 146 of FIG. 2, networking unit 152, etc.). DPU 150 may store the retrieved probability values in local memory, and access the local memory when determining the actual probability values for the plurality of bits.

Figure 4:
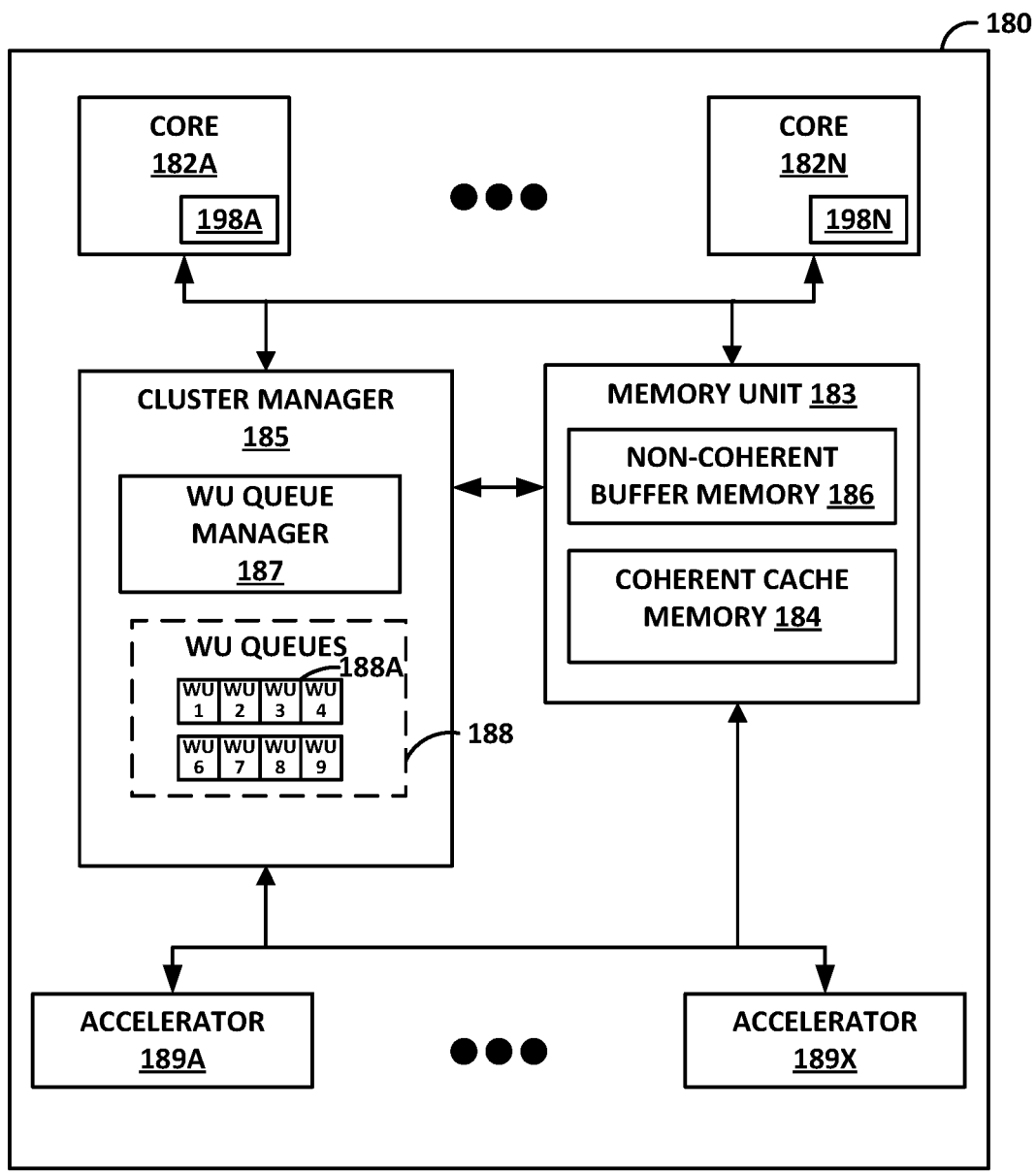
FIG. 4 is a block diagram illustrating an example processing cluster including two or more processing cores.

FIG. 4 is a block diagram illustrating an example processing cluster 180 including two or more processing cores 182A-182N. Each of processing clusters 156 of DPU 150 of FIG. 3 may be configured in a manner substantially similar to that shown in FIG. 4. In the example of FIG. 4, processing cluster 180 includes cores 182A-182N ("cores 182"), a memory unit 183 including a coherent cache memory 184 and a non-coherent buffer memory 186, a cluster manager 185 including WU queue manager 187 for maintaining (e.g., within hardware registers of processing cluster 180) and manipulating WU queues 188, and accelerators 189A-189X ("accelerators 189"). Each of cores 182 includes L1 buffer cache 198 (i.e., core 182 includes L1 buffer cache 198A and in general, core 182N includes L1 buffer cache 198N). Although not shown, accelerators 189 may also include L1 buffer caches. In some examples, cluster manager 185 is alternatively located within central cluster 158, and/or WU queues 188 are alternatively maintained within central cluster 158 (e.g., within hardware registers of central cluster 158).

An access node or DPU (such as access nodes 17 of FIG. 1, DPU 130 of FIG. 2, or DPU 150 of FIG. 3) may support two distinct memory systems: a coherent memory system and a non-coherent buffer memory system. In the example of FIG. 4, coherent cache memory 184 represents part of the coherent memory system while non-coherent buffer memory 186 represents part of the non-coherent buffer memory system. Cores 182 may represent the processing cores discussed with respect to DPU 150 of FIG. 3. Cores 182 may share non-coherent buffer memory 186. As one example, cores 182 may use non-coherent buffer memory 186 for sharing streaming data, such as network packets.

In general, accelerators 189 perform acceleration for various data-processing functions, such as table lookups, matrix multiplication, cryptography, compression/decompression, regular expressions, or the like. That is, accelerators 189 may comprise hardware implementations of lookup engines, matrix multipliers, cryptographic engines, compression/decompression engines, regular expression interpreters, or the like. For example, accelerators 189 may include a lookup engine that performs hash table lookups in hardware to provide a high lookup rate. The lookup engine may be invoked through work units from external interfaces and virtual processors of cores 182, and generates lookup notifications through work units. Accelerators 189 may also include one or more cryptographic units to support various cryptographic processes. Accelerators 189 may also include one or more compression/decompression units to perform compression and/or decompression.

An example process by which a processing cluster 180 processes a work unit is described here. Initially, cluster manager 185 of processing cluster 180 may queue a work unit (WU) in a hardware queue of WU queues 188. When cluster manager 185 "pops" the work unit from the hardware queue of WU queues 188, cluster manager 185 delivers the work unit to one of accelerators 189, e.g., a lookup engine. The accelerator 189 to which the work unit is delivered processes the work unit and determines that the work unit is to be delivered to one of cores 182 (in particular, core 182A, in this example) of processing cluster 180. Thus, the one of accelerators 189 forwards the work unit to a local switch of the signaling network on the DPU, which forwards the work unit to be queued in a virtual processor queue of WU queues 188.

As noted above, in accordance with the techniques of this disclosure, one or more of accelerators 189 may be configured to perform range coding. As described above, as part of the range coding, a range coder of accelerators 189 may retrieve speculative probability values for a plurality of bits in response to a single read instruction to external memory 170. The range coder may determine the actual probability value for a bit in the plurality of bits based on the retrieved speculative probability values.

Also, in some examples, in response to switching data streams, one or more of cores 182 or accelerators 189 may compress the state information stored in local memory (e.g., cache 198 of accelerators 189), and store the compressed state information in external memory. Accelerators 189 or cores 182, alone or in combination, may retrieve the compressed state information and decompress the compressed state information to generate reconstructed state information, as part of a switch back to the data stream used to generate the state information that was compressed.

After cluster manager 185 pops the work unit from the virtual processor queue of WU queues 188, cluster manager 185 delivers the work unit via a core interface to core 182A, in this example. An interface unit of core 182A then delivers the work unit to one of the virtual processors of core 182A.

Core 182A processes the work unit, which may involve accessing data, such as a network packet or storage packet, in non-coherent memory 156A and/or external memory 170. Core 182A may first look for the corresponding data in cache 198A, and in the event of a cache miss, may access the data from non-coherent memory 156A and/or external memory 170. In some examples, while processing the work unit, core 182A may store information (i.e., the network packet or data packet) associated with the work unit in an active segment of cache 198A. Further, core 182A may, while processing the work unit, prefetch data associated with a second work unit into a different, standby segment of cache 198A. When core 182A completes processing of the work unit, core 182A initiates (or causes initiation of) a cache flush for the active segment, and may also initiate prefetching of data associated with a third work unit (to be processed later) into that active segment. Core 182A (or a virtual processor within core 182A) may then swap the active segment and the standby segment so that the previous standby segment becomes the active segment for processing of the next work unit (i.e., the second work unit). Because data associated with the second work unit was prefetched into this now active segment, core 182A (or a virtual processor within core 182A) may be able to more efficiently process the second work unit. Core 182A then outputs corresponding results (possibly including one or more work unit messages) from performance of the work unit back through the interface unit of core 182A.

In some example implementations, load store units within memory unit 183 may, concurrent with execution of work units by cores 182 within the processing cluster 180, identify work units that are enqueued in WU queues 188 for future processing by the cores. The load store units prefetch, from a non-coherent memory portion of external memory 170, data associated with the future work units and store the prefetched data associated with the WUs to be processed by the cores into a standby segment of the level 1 cache associated with the particular processing cores.

Figure 5:
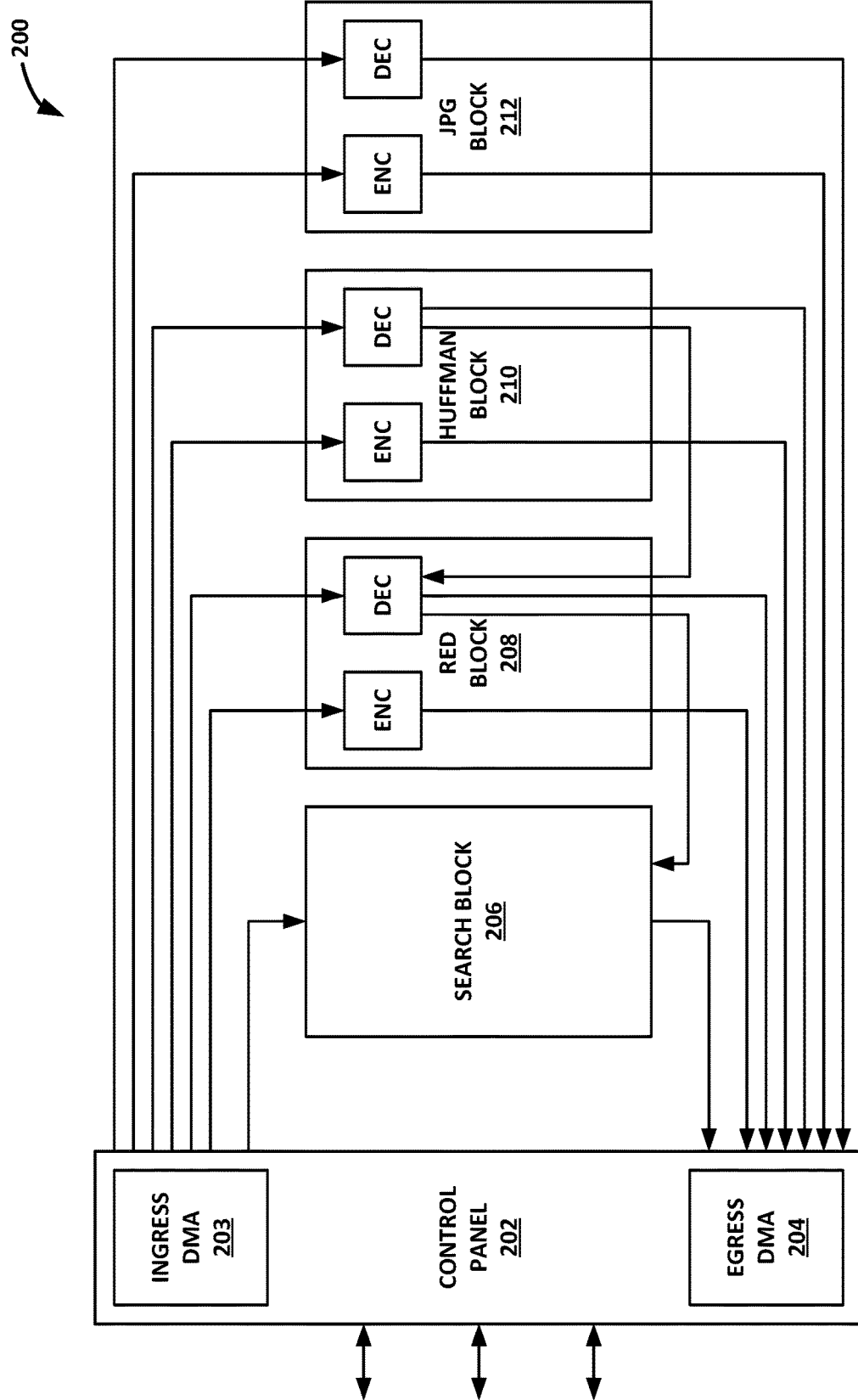
FIG. 5 is a block diagram illustrating an example data compression/decompression accelerator.

FIG. 5 is a block diagram illustrating an example data compression/decompression accelerator 200. For example, data compression/decompression accelerator 200 may be one or more of accelerators 146 of data processing unit 130 from FIG. 2, or one or more of accelerators 189 of processing cluster 180 from FIG. 4. In some examples, data compression/decompression accelerator 200 may be included in each of processing clusters 156 of data processing unit 150 from FIG. 3.

Data compression/decompression accelerator 200 is configured to accelerate the computationally intensive data compression and decompression operations conventionally performed by software running on a general purpose processor. As illustrated in FIG. 5, data compression/decompression accelerator 200 includes a control panel 202, a search block 206, a range encode/decode (RED) block 208, a Huffman encode/decode block 210, and a JPG re-encode/decode block 212. RED block 208 is an example of the range coder described above.

With these components, as described in more detail below, data compression/decompression accelerator 200 may support DEFLATE compression and decompression used by gzip and zlib, support Lempel-Ziv-Markov chain algorithm (LZMA) compression and decompression, and support JPG re-compression and decompression. DEFLATE compression comprises a lossless data compression algorithm that uses a combination of a dictionary-based compression scheme performed by search block 206 and Huffman encoding performed by Huffman block 210. For example, the dictionary-based compression scheme may comprise one of the LZ77, LZ78, LZW, LZ4, LZO, or LZS algorithms. The DEFLATE compression and decompression is described in more detail in P. Deutsch, "DEFLATE Compressed Data Format Specification version 1.3," IETF Network Working Group, R F C 1951, May 1996. LZMA compression comprises another lossless data compression algorithm that uses a combination of a dictionary-based compression scheme performed by search block 206 and range encoding performed by RED block 208. JPG re-compression comprises lossy compression for digital images performed by JPG block 212.

Control panel (CP) 202 of data compression/decompression accelerator 200 operates as an interface to the other blocks in data compression/decompression accelerator 200, and is the only block in data compression/decompression accelerator 200 with external interfaces. CP 202 controls the mode of operation, manages WUs, and tracks resources and schedules jobs to the engine blocks (i.e., search block 206, RED block 208, Huffman block 210, and JPG block 212) within data compression/decompression accelerator 200. CP 202 also provides ingress DMA 203 and egress DMA 204. The engine blocks within data compression/decompression accelerator 200 work on a stream of data and there are no random accesses to external memories or to external blocks. External interfaces of CP 202 are used for receiving WUs, sending WUs, receiving payload data, sending result data, and receiving configuration data. Internal interfaces between the engine blocks within data compression/decompression accelerator 200 are mostly streaming interfaces. The internal interfaces may use credit-based flow control. For example, at the beginning of a job there may be N flow control units ('flits') of header data that describe the job.

CP 202 is responsible for controlling access to shared resources that can be used by multiple of the engine blocks within data compression/decompression accelerator 200. Any scheduling of resources local to a specific one of the engine blocks may be done locally by that engine block. For example, search block 206 and RED block 208 may share a history buffer local to search block 206. As another example, RED block 208 and Huffman block 210 may share one or more history buffers local to RED block 208. Certain WUs may depend on one or more of the shared resources. As such, CP 202 may control the resource assignment and only schedule WUs that do not conflict with the current resource assignment. The engine blocks within data compression/decompression accelerator 200 may not be able to detect or resolve shared resource conflicts themselves. In addition, several of the engine blocks within data compression/decompression accelerator 200, e.g., search block 206, RED block 208, and Huffman block 210, may have multiple threads. Some of the engine blocks, e.g., at least search block 206, may have both a single thread mode and a multi thread mode, depending on the type of job being processed.

Search block 206 may be the first stage of a two-stage compression process performed by data compression/decompression accelerator 200. For example, search block 206 may be configured to perform a dictionary-based compression algorithm (e.g., the LZ77 algorithm or variants thereof) to search for and replace repeated occurrences of strings of bytes in an input data file. Search block 206 uses a local a history buffer that includes previously seen data as the dictionary for the compression algorithm. Search block 206 is configured to scan the input data file for repeated strings within a history window, and replace the repeated strings with length-distance pairs that point to previous occurrences of the strings. The output of search block 206 includes one or both of literals (i.e., strings of bytes) and length-distance pairs used to replace repeated strings of bytes. The output of search block 206 may then go through a second stage of compression using entropy encoding, either using Huffman encoding performed by Huffman block 210 or range encoding performed by RED block 208.

The dictionary-based decompression operation involves expanding the length-distance pairs into strings of bytes based on a history buffer. For example, the dictionary-based decompression operation may be performed by RED block 208 since the latency of the decompression operation affects the throughput of search block 206. In the case where the history buffer for the dictionary-based decompression operation is small (e.g., less than or equal to 32 KB), RED block 208 may use a history buffer that is local to RED block 208. In the case where the history buffer for the dictionary-based decompression operation is large (e.g., greater than 32 KB), RED block 208 may use its local buffer as a cache and use the history buffer at search block 206 for up to the maximum supported history buffer size, e.g., 256 KB. When RED block 208 uses the history buffer at search block 206, search block 206 may be disabled. Therefore, the dictionary-based encode/decode operation using a small history buffer may be full duplex, and the dictionary-based encode/decode operation using a large history buffer is half duplex.

Following the dictionary-based compression (e.g., the LZ77 algorithm) performed by search block 206, the encode (ENC) portion of Huffman block 210 may perform the second stage of the two-stage compression process for DEFLATE compression used by gzip and zlib. The output of search block 206 is the input to the encode portion of Huffman block 210. The encode portion of Huffman block 210 performs Huffman encoding, which is a type of entropy encoding that replaces high frequency symbols with shorter codewords and low frequency symbols with longer codewords. As a first step, encoder circuit 214 of Huffman block 210 gathers a frequency histogram for every symbol in a block of data, and stores the data in a buffer as the statistics are counted. As a second step, Huffman block 210 assigns codewords based on the frequency of each symbol. In parallel with this step, the next block of data arrives in a second buffer. As a third step, Huffman block 210 outputs the encoding table (e.g., codeword table), which also gets compressed. As a fourth step, Huffman block 210 outputs the encoded data. As the buffer is being drained, the next block begins filling the buffer. There are two buffers per thread. In some examples, Huffman block 210 has two threads such that there are a total of four buffers.

The decode (DEC) portion of Huffman block 210 may perform a first stage of a decompression process for DEFLATE format compressed data used by gzip and zlib. Huffman block 210 decodes a binary data stream of encoded symbols, represented as codewords, and replaces them with the original symbols. The encoded symbols (e.g., the codewords) are of variable length, so the length of the previous codeword determines where the next codeword to be decoded begins in the data stream. This chain of dependencies typically makes fast decoding challenging. The output of decoder circuit 216 of Huffman block 210 is a sequence of literals and/or length-distance pair symbols. The literals directly represent the original data (i.e., strings of bytes), and the length-distance pairs are pointers to previous occurrences of a string of bytes within a sliding history window. The second stage of the decompression process for DEFLATE is to expand the length-distance pairs. For DEFLATE, the symbol decode and the expansion are independent operations and, therefore, the operations may be performed by separate engine blocks.

In some cases, LZMA specification does not support static dictionary. RED block 208 may be configured to extend LZMA to support the static dictionary as '(dynamic dictionary+word offset)'.

RED block 208 performs range encoding and range decoding. The range encode (ENC) portion of RED block 208 is a data stream encoder that compresses one bit at a time. The range encoding algorithm is comparable to arithmetic encoding. The range encode portion of RED block 208 uses a context memory that provides a probability of a 1 or 0 based the current context. The context memory is updated on the fly during compression and that process is precisely mirrored during decompression. In general, range encoding provides higher compression than Huffman encoding at the cost of lower throughput, larger area, and higher complexity. An example of range encoding is described with respect to FIG. 8.

In general, during range encoding, the encode portion of RED block 208 reads probability values to determine how to apportion a range space into sub-portions, and determines the sub-portion to which a symbol belongs. The sub-portion to which the symbol belongs can be represented as a range value and a low value, which are decimal values (e.g., values between 0 and 1), as one non-limiting example. The encode portion of RED block 208 may determine a plurality of bits having a decimal value that is within the sub-portion (e.g., greater than the low value, and less than the low value plus the range value). The resulting plurality of bits are the encoded version of the symbol.

In some examples, it may not be possible to wait until all symbols are encoded and then pick a number between 'low' and 'range' to represent the encoded symbol sequence, due to the limitation on number of bits needed to represent 'low' and 'range.' Accordingly, the range encoder may start outputting bits as and when the values cross number of bits to hold 'low' and 'range' values (e.g., 32 or 64 bits). For example, if the low or range value gets bigger than 32 or 64 bits, the range coder may output the low or range value so as to not overflow.

In one or more examples, the encode portion of RED block 208 determines probability values, used to apportion the range space into sub-portions, based on context values of one or more contexts. Contexts, as described above, are information derived from characteristics of previously encoded data (e.g., bit value of a previous bit, position of a previous bit, classification of previously encoded data, etc.). A context value is a value used to indicate a value of the context.

As described above, because there could be many different combinations of the context values, the number of probability values may be relatively large. Accordingly, a on-chip memory (e.g., memory unit 134 of FIG. 2 or memory unit 183 of FIG. 3) stores the probability values in a multi-dimensional table of probability values. For example, local memory (e.g., level 1 cache or registers of RED block 208) may not provide sufficient memory to store all possible probability values. The context values of the contexts for encoding may together form as an index to the table of probability values from which the encode portion of RED block 208 retrieves the probability value needed for encoding a bit.

In one or more examples, the encode portion of RED block 208 determines that a context value for a particular context is the same for a plurality of bits. In this example, the encode portion of RED block 208 may retrieve all potential probability values (e.g., speculative probability values) associated with the context value for the particular context. Each of the retrieved probability values may be associated with different combinations of context values for different contexts, except for one of the contexts, for which the context value is the same. For instance, assume that two contexts are used to encode, and assume that a context value for a first context may be the same for a plurality of bits. In this example, the encode portion of RED block 208 may retrieve all potential probability values associated with the first context having the particular context value. Each of the retrieved probability values may be associated with the first context having the particular context value, and a second context having different values.

The encode portion of RED block 208 may store the retrieved probability values in its local memory (e.g., level 1 cache 141 or internal registers), which may be large enough to store all probability values associated with a particular context value for a context, but not large enough to store the entire table of probabilities. Because all bits of the plurality of bits have the same context value for the first context, there is a high likelihood that the actual probability values used for encoding the plurality of bits are within the retrieved probability values stored in the local memory. Accordingly, the encode portion of RED block 208 may access the local memory to determine the probability values for the plurality of bits, rather than repeatedly accessing the on-chip memory.

Following the dictionary-based compression (e.g., the LZ77 algorithm) performed by search block 206, the encode portion of RED block 208 may perform the second stage of the two-stage compression process for LZMA compression. Data compression/decompression accelerator 200 may have two modes of operation for LZMA compression. In a streaming mode, the output of search block 206 is directly sent to RED block 208 using one WU. In some cases, however, there may be a speed mismatch where search block 206 is running faster than RED block 208. To optimize this case, a second mode of operation decouples the search stage from the RED stage using a separate WU for each stage. In the second mode of operation, the intermediate results are directly stored to and accessed from on-chip memory via ingress DMA 203 and egress DMA 204. In the second mode of operation, RED block 208 may use multiple encoding threads to better match the throughput of search block 206.

In some examples, it may be possible for the ENC portion of RED block 208 to not produce any output for many symbols, and then output a burst of bytes. To handle this, in some examples, the buffer to which END portion of RED block 208 outputs includes a margin from the end of the buffer used to detect the overflow and stop the operation without actually overflowing the output buffer in most cases.

The decode (DEC) portion of RED block 208 may perform a first stage of a decompression process for LZMA format compressed data. The decode portion of RED block 208 receives the data to be decoded from ingress DMA 203 and sends the results out over egress DMA 204. Depending on the size of the history buffer used during LZMA compression, RED block 208 may use small internal history buffers, which allows for full duplex encode/decode, or RED block 208 may use a large external history buffer from search block 206, which only allows for half duplex encode/decode. Search block 206 may be disabled when RED block 208 is decoding using the large external history buffer local to search block 206.

In some examples, DEC portion of RED block 208 may store already decoded symbols into context. To avoid such a case, there may be a margin in the buffer to which the DEC portion of RED block 208 outputs with a minimum length equal to the maximum supported length (e.g., 273, which is the maximum length supported in LZMA).

Similar to Huffman decoding for DEFLATE, range decoding for LZMA decompression involves decoding symbols and expanding symbols that reference a history buffer. Unlike Huffman decoding, the expansion of the symbols in range decoding may affect the context used to decode the next symbol. In addition to perform range decoding for LZMA decompression, the decode portion of RED block 208 also performs the second stage of Huffman decoding for DEFLATE, i.e., the length-distance pair expansion. In this case, the decode portion of RED block 208 receives the input from Huffman block 210, and generates the final result that is sent out over egress DMA 204.

In one or more examples, RED block 208 is configured to perform example techniques described in this disclosure. For instance, encode portion of RED block 208 may determine the context values for the various contexts used to encode bit-by-bit the plurality of bits used to represent a symbol that encode portion of RED block 208 receives. Based on the determined context values for the various contexts, the encode portion of RED block 208 may determine a probability value for the bit used to perform the range encoding.

On the decode portion, the decode portion of RED block 208 may perform reciprocal operations. For example, the decode portion of RED block 208 receives range encoded bits. The range encoded bits of a plurality of bits used to represent a symbol. The decode portion of RED block 208 determines probability values for a plurality of bits used to represent the symbol. These plurality of bits, used to represent the symbol, are the resulting decoded bits, and different from the encoded bits that are received. From the probability values, the decode portion of RED block 208 may determine range and low values, and divide a range space into sub-portions based on the determined range and low values. The decode portion of RED block 208 may convert the received encoded bits into a decimal value, and determine the sub-portion in the range space within which the decimal value resides. Based on the determined sub-portion, the decode portion of RED block 208 determines the plurality of bits used to represent the symbol. In this way, the decode portion of RED block 208 decodes the range encoded bits.

In one or more examples, the decode portion of RED block 208 determines probability values, used to apportion the range space into sub-portions, based on context values of one or more contexts. As described above, due to the large number of probability values (e.g., from the different combination of context values for different contexts), a on-chip memory stores the probability values in a multi-dimensional table of probability values. The context values of the contexts for decoding may together form as an index to the table of probability values from which the decode portion of RED block 208 retrieves the probability value needed for decoding a bit.

In one or more examples, the decode portion of RED block 208 determines that a context value for a particular context is the same for a plurality of bits. In this example, the decode portion of RED block 208 may retrieve all potential probability values (e.g., speculative probability values) associated with the context value for the particular context. Each of the retrieved probability values may be associated with different combinations of context values for different contexts, expect for one of the contexts, for which the context value is the same. To restate the above example, assume that two contexts are used to decode, and assume that a context value for a first context may be the same for a plurality of bits. In this example, the decode portion of RED block 208 may retrieve all potential probability values associated with the first context having the particular context value. Each of the retrieved probability values may be associated with the first context having the particular context value, and a second context having different values.

The decode portion of RED block 208 may store the retrieved probability values in its local memory, which may be large enough to store all probability values associated with a particular context value for a context, but not large enough to store the entire table of probabilities. Because all bits of the plurality of bits have the same context value for the first context, there is a high likelihood that the actual probability values used for encoding the plurality of bits are within the retrieved probability values stored in the local memory. Accordingly, the decode portion of RED block 208 may access the local memory to determine the probability values for the plurality of bits, rather than repeatedly accessing the memory.

In one or more examples, the on-chip memory that stores the table of probability values may be arranged in a specific way to allow retrieval of the probability values in response to a single read instruction to the on-chip memory. As one example, a single read instruction to the on-chip memory means that a processing core (e.g., of FIG. 2 or 4) or a processing cluster (e.g., FIG. 3) issues only one read instruction, and from that read instruction RED block 208 receives the speculatively probability values. It may be possible for RED block 208 to issue the single read instruction as well. The memory that includes the probability values may be on-chip and close to RED block 208. This memory may not be a general-purpose memory available to all blocks, although it is possible for the memory to be available to all blocks or to blocks in addition to RED block 208.

In some examples, it may be possible that a software application includes a read instruction to read probability values for a plurality of bits, and the application divides the read instructions into a plurality of read instructions to read the probability values one-by-one from the on-chip memory. In one or more examples, rather than having multiple accesses to the on-chip memory to read probability values one-by-one, RED block 208 may read the probability values as a batch with one single read instruction that is issued to the on-chip memory.

The on-chip memory may store the table of probabilities such that a context value for a first context is an index into a row or column, and a context value for a second context is an index into the other one of the row or column. In some examples, if the context value for a first context used to determine probability values is the same for the plurality of bits, RED block 208 (e.g., encode portion or decode portion, as applicable) reads all of the probability values stored in the row indexed by the first context. If the context value for a second context used to determine probability values is the same for the plurality of bits, RED block 208 reads all of the probability values stored in the column indexed by the second context.

As also described above, in some examples, RED block 208 may switch between data streams. For example, RED block 208 may be compressing or decompressing a first set of packets of a first data stream generated from execution of a first application, and RED block 208, during the compressing or decompressing, receives a first set of packets of a second data stream generated from execution of a second application. To ensure timely compression or decompression, RED block 208 may interleave the compression and decompression. For example, RED block 208 may switch to compressing or decompressing the first set of packets of the second data stream, and then switch back to compressing or decompressing a second set of packets of the first data stream.

In some examples, RED block 208 may switch at the completion of coding one or more packets. For instance, RED block 208 may not switch coding mid-packet. In this way, RED block 208 may switch at packet boundaries, where one or more packets form a chunk of the data stream. For instance, RED block 208 may be configured to switch at chunk boundaries.

In one or more examples, to ensure that the table of probability values and range and low values are available when RED block 208 switches back from the second data stream to the first data stream, as part of the switching from the first data stream to the second data stream, processing circuitry (e.g., RED block 208 or possibly some other circuitry, alone or in combination with RED block 208) compresses state information (e.g. the table of probability values and range and low values) for storage in external memory such as external memory 170. The processing circuitry may compress the state information upon completion of coding one or more packets of the first data stream, and upon request to switch from the first data stream to the second data stream. For example, the processing circuitry may compress the state information at a packet boundary or at a chunk boundary, where a chunk is one or more packets.

Then upon switching back to the first data stream, the processing circuitry retrieves and decompresses the compressed state information to reconstruct the state information. The processing circuitry then uses the reconstructed state information to begin compressing or decompressing the second set of packets of the first data stream.

JPG block 212 may losslessly re-encode jpg files into a proprietary format. Standard jpg files may be compressed in two phases, first a lossy phase and then second a lossless phase using Huffman encoding. JPG block 212 is configured to replace the lossless phase with a more advanced compression algorithm. Similar to RED block 208, JPG block 212 uses an adaptive context-based bit-wise encoder, but it has been specifically optimized for image data. JPG block 212 performs compression and decompression of image data independently from the other engine blocks within data compression/decompression accelerator 200 and is only in communication with CP 202.

Figure 6B:
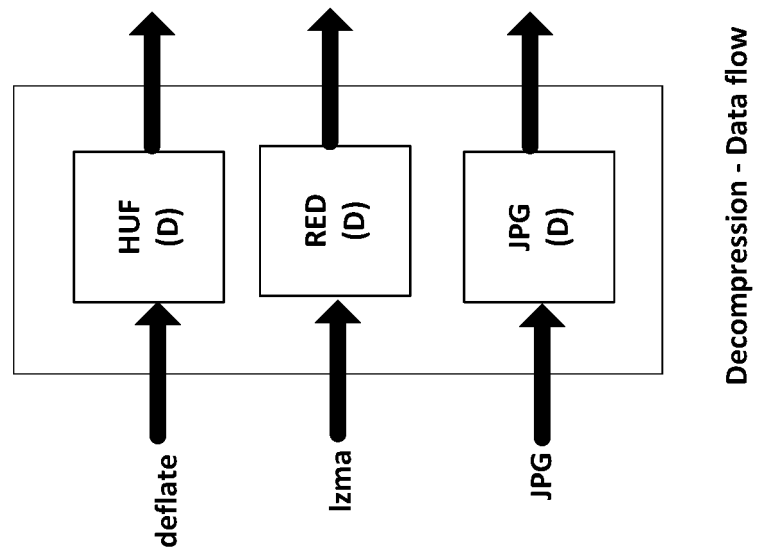
FIGS. 6A and 6B are conceptual diagrams illustrating example data flows through engine blocks within a data compression/decompression accelerator of FIG. 5.
Figure 6A:
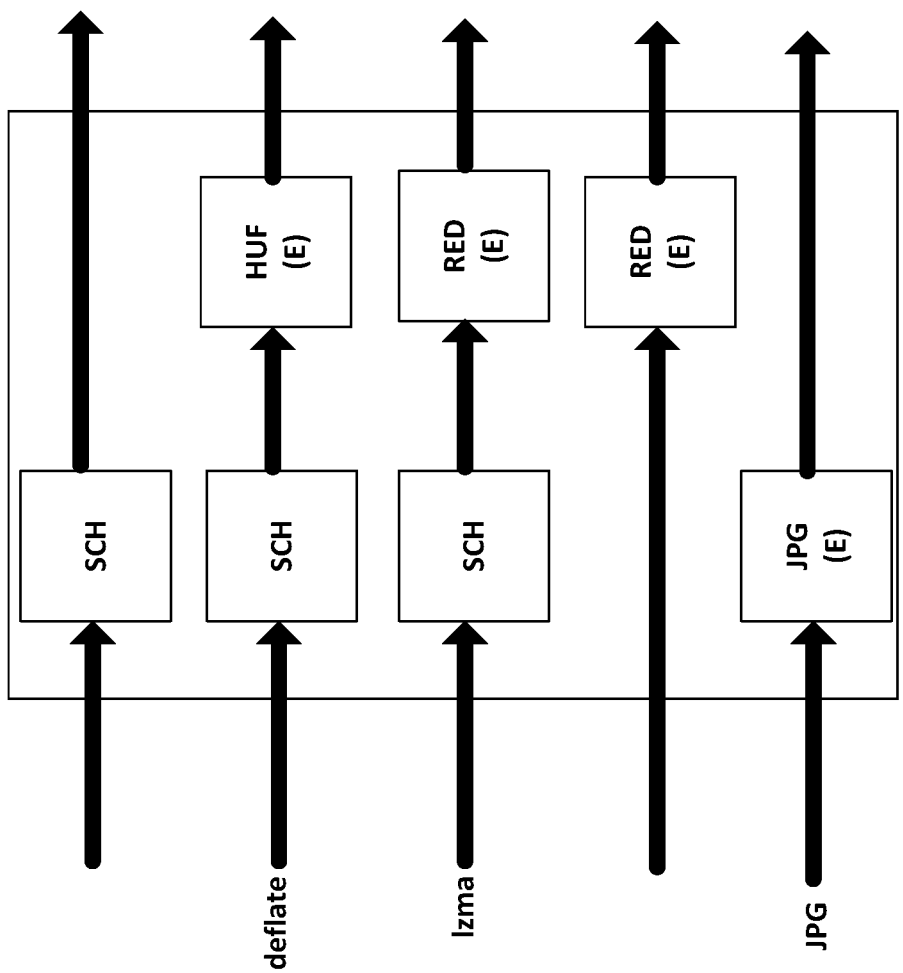

FIGS. 6A and 6B are conceptual diagrams illustrating example data flows through engine blocks within data compression/decompression accelerator 200 of FIG. 5. FIG.

6A illustrates example compression data flows. As illustrated in FIG. 6A, data compression/decompression accelerator 200 may perform dictionary-based compression alone using only search block 206, DEFLATE compression using a combination of search block 206 and the encode portion of Huffman block 210, LZMA compression using a combination of search block 206 and the encode portion of RED block 208, range encoding alone using RED block 208, or JPG re-compression using JPG block 212. FIG. 6B illustrates example decompression data flows. As illustrated in FIG. 6B, data compression/decompression accelerator 200 may perform the first stage of DEFLATE decompression using the decode portion of Huffman block 210, the first stage of LZMA decompression using the decode portion of RED block 208, or JPG decompression using JPG block 212. In the case of both DEFLATE and LZMA decompression, RED block 208 may perform the second stage of decompression, i.e., length-distance pair expansion.

Figure 7:
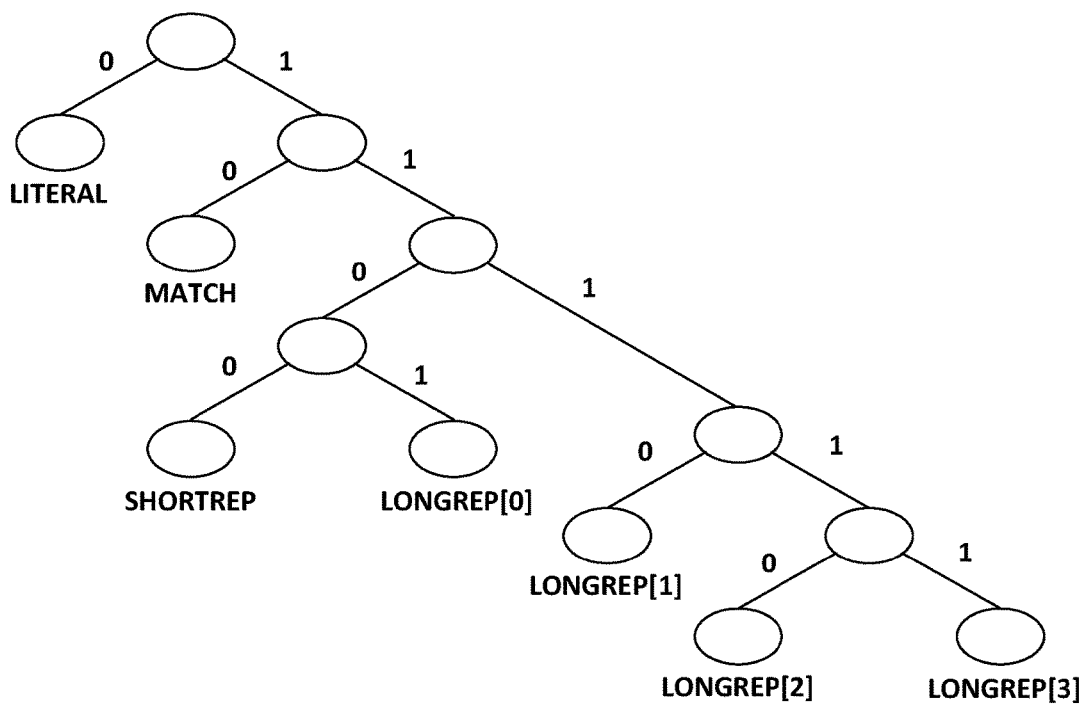
FIG. 7 is a conceptual diagram illustrating an example of a coding tree used for coding in accordance with Lempel-Ziv-Markov chain algorithm (LZMA).

FIG. 7 is a conceptual diagram illustrating an example of a coding tree used for coding in accordance with Lempel-Ziv-Markov chain algorithm (LZMA). For example, RED block 208 encodes (compresses) or decodes (decompresses) a stream of symbols in accordance with the tree illustrated in FIG. 7. Examples of the symbols include literals or length, distance pairs. The literal is a byte string, and a length, distance pair is indicative of a distance value to a previous occurrence of matching byte string and a length value of the match.

In LZMA, the symbols are encoded as a tree of bits with a header, as illustrated in FIG. 7. For example, literals (LIT) are encoded as a 1-bit zero followed by 8 bits of value. Length, distance pairs are categorized into six different variants. RED block 208 stores last four used distance values with start with zero. The last four distance values are presented as LONGREP[0] to LONGREP[3]. LONGREP [0] with 'length=1' is referred to as SHORTREP. If the distance is not one of the last four used distances, RED block 208 encodes it as a MATCH.

Table 1 below illustrates an example of the different bit sequences and the respective packet names and packet description when coding based on the example tree illustrated in FIG. 7.

TABLE 1

| Bit sequence for LZMA | | |
|---|---|---|
| packed code (bit sequence) | packet name | packet description |
| 0 + byteCode | LIT | A single byte encoded using an adaptive binary range coder. |
| 1 + 0 + len + dist | MATCH | A typical LZ77 sequence describing sequence length and distance. |
| 1 + 1 + 0 + 0 | SHORTREP | A one-byte LZ77 sequence. Distance is equal to the last used LZ77 distance. |
| 1 + 1 + 0 + 1 + len | LONGREP[0] | An LZ77 sequence. Distance is equal to the last used LZ77 distance. |
| 1 + 1 + 1 + 0 + len | LONGREP[1] | An LZ77 sequence. Distance is equal to the second last used LZ77 distance. |
| 1 + 1 + 1 + 1 + 0 + len | LONGREP[2] | An LZ77 sequence. Distance is equal to the third last used LZ77 distance. |

TABLE 1-continued

| Bit sequence for LZMA | | |
|---|---|---|
| packed code (bit sequence) | packet name | packet description |
| 1 + 1 + 1 + 1 + 1 + len | LONGREP[3] | An LZ77 sequence. Distance is equal to the fourth last used LZ77 distance. |

As described in more detail below, RED block 208 may encode or decode the example plurality of bits (e.g., bit sequence in Table. 1) using context based coding techniques. Prior to describing the example ways in which context values are determined for coding the plurality of bits, the following provides an example of range coding techniques.

Figure 8:
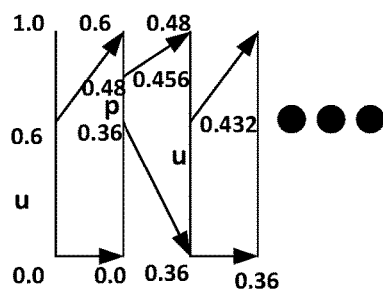
FIG. 8 is a conceptual diagram illustrating an example of range coding or arithmetic coding.

FIG. 8 is a conceptual diagram illustrating an example of range coding or arithmetic coding. In the example illustrated in FIG. 8, the letters u, p, u, n, e, p are being encoded using range coding. In an initial state, the probability of letters u, p, n, and e (e.g., how often these letters are present in the file being encoded) may be unknown, and RED block 208, or possibly one of the processing cores, may initialize a table of probability values so that each letter is initialized with a probability of 0.5. RED block 208, or possibly one of the processing cores, updates the table of probability values after encoding. For instance, as described above, RED block 208 determines an index into the table of probability values using some context values for contexts such as previous symbol or certain offset values described in more detail, reads the probability value from the table, and updates the probability and writes it back if necessary.

As shown in the table illustrated in FIG. 8, assume that RED block 208, or possibly one of the processing cores, determined that the letter u has a frequency of 60%, the letter p has a frequency of 20%, the letter n has a frequency of 10%, and the letter e has a frequency of 10%. Also, as shown in the table illustrated in FIG. 8, RED block 208 assigned apportioned (e.g., divided) a range space such that a sub-portion of the range space for the letter u is 60% of the range space with an interval from 0 to 0.6, a sub-portion of the range space for letter p is 20% of the range space with an interval from 0.6 to 0.8, a sub-portion of the range space for letter n is 10% of the range space with an interval from 0.8 to 0.9, and a sub-portion of the range space for letter e is 10% of the range space with an interval from 0.9 to 1.0.

As described above, as part of range coding, RED block 208 updates a low value and a range value in respective low and range registers. In this example, assume that the encode portion of RED block 208 is encoding u, p, u, n, e, p . . . . Accordingly, RED block 208 initially sets the low value to 0 and range value to 0.6 because u is being encoded an in the original range space, the interval for u was 0 to 0.6.

The 0 to 0.6 now sets the next range space for encoding the letter p. RED block 208 determines the sub-portion for p within the new range space that is from 0 to 0.6. In this example, the letter p is assigned the interval of 0.6 to 0.8. Therefore, RED block 208 determines the sub-portion of p within the 0 to 0.6 range space as 0.36 to 0.48 because the 0.6 to 0.8 interval in a 0 to 1 space for the letter p maps to 0.36 to 0.48 in a 0 to 0.6 scale. RED block 208 updates the low value to 0.36 and the range value to 0.12 because 0.36 plus 0.12 equals 0.48.

The 0.36 to 0.48 sets the new range space for encoding the letter u. RED block 208 determines the sub-portion for u within the new range space that is from 0.36 to 0.48. In this example, the letter u is assigned the interval of 0 to 0.6. Therefore, RED block 208 determines the sub-portion of u within the 0.36 to 0.48 range space as 0.36 to 0.432 because the 0 to 0.6 interval in the 0 to 1 space for the letter u maps to 0.36 to 0.432. RED block 208 keeps the low value equal to 0.36 and updates the range value to 0.072 because 0.36 plus 0.072 equals 0.432.

In the example illustrated in FIG. 8, no contexts are used to determine the probability values. However, in some examples of range coding, RED block 208 may determine context values for one or more contexts and determine the probability values based on the context. Examples of the context and the context values are described in more detail below with respect to LZMA.

Table 2 illustrates an example of the various contexts used for encoding and decoding symbols. The example symbols are those generated for LITERAL, MATCH, SHORTREP, LONGREP[0], LONGREP[1], LONGREP[2], and LONGREP[3]. In the below example, is_match indicates whether a symbol is a literal or the right side of the tree is to be traversed. The is_rep indicates whether the symbol is coded as a match or the right side of the tree is to be traversed. The is_rep0 indicates whether the symbol is coded as SHORTREP or LONGREP[0] or as one of LONGREP[1-3]. The is_rep( ) long indicates whether symbol is coded as SHORTREP or LONGREP[0]. The is_rep1 indicates whether the symbol is coded as LONGREP[1] or one of LONGREP[2] or LONGREP[3]. The is_rep2 indicates whether the symbol is coded as LONGREP[2] or LONGREP[3].

The value of "state" is based on the four previous packet types (e.g., whether LIT, MATCH, SHORTREP, or one of LONGREP[0-3]). Table 3 shows the example values of state from 0 to 11 (i.e., there are 12 possible values for the state).

TABLE 3

State Context for LZMA coding

| | PREVIOUS PACKET | | | |
|---|---|---|---|---|
| STATE | $4^{TH}$ PREVIOUS | $3^{RD}$ PREVIOUS | $2^{ND}$ PREVIOUS | PREVIOUS |
| 0 | | LIT | LIT | LIT |
| 1 | | MATCH | LIT | LIT |
| 2 | *MATCH | LONGREP[*] SHORTREP | LIT | LIT |
| 3 | LIT | SHORTREP | LIT | LIT |
| 4 | | | MATCH | LIT |
| 5 | | | LONGREP[*] SHORTREP | LIT |
| 6 | | *MATCH LIT | SHORTREP | LIT |
| 7 | | | LIT | MATCH |
| 8 | | | LIT | LONGREP[*] |
| 9 | | | LIT | SHORTREP |
| 10 | | | *MATCH | MATCH |
| 11 | | | *MATCH | *REP |

For coding a literal, the contexts are prev_byte_lc_msbs, Literal_pos_state, bit position, and bit-tree context. The value of prev_byte_lc_msbs is equal to the four most significant bits of the previous uncompressed byte. The

TABLE 2

Contexts uses for LZMA coding

| NAME | CONTEXT | USED WHEN | CODING MODE | IF BIT 0 THEN | IF BIT 1 THEN |
|---|---|---|---|---|---|
| Is_match | State, pos_state | Packet start | Bit | LIT | *MATCH |
| Is_rep | State | After bit sequence 1 | Bit | MATCH | *REP |
| Is_rep0 | State | After bit sequence 11 | Bit | SHORTREP/ LONGREP[0] | LONGREP[1-3] |
| Is_rep0_long | State, pos_state | After bit sequence 110 | Bit | SHORTREP | LONGREP[0] |
| Is_rep1 | State | After bit sequence 111 | Bit | LONGREP[1] | LONGREP[2/3] |
| Is_rep2 | State | After bit sequence 1111 | Bit | LONGREP[2] | LONGREP[3] |
| Literal | Prev_byte_1c_msbs, Literal_pos_state, literal_bit_mode[bit position], bit-tree context | After bit sequence 0 | 256 values pseudo- bit-tree | Literal byte value | |

In table 2, for coding Is_match, Is_rep, Is_rep0, Is_rep0_long, Is_rep1, and Is_rep2, RED block 208 uses the context "state," and for Is_match and Is_rep0_long also uses the context "pos_state." The value of pos_state is equal to four least significant bits of the dictionary (e.g., history) position (e.g., the number of bytes coded since the last dictionary reset modulo the dictionary size). The dictionary (e.g., history) position refers to the offset of the byte within the uncompressed data stream. For example, if the data being compressed is "HELLOWORLD," dictionary (e.g., history) position of literal "W" is 5 ("H" is 0, "E" is 1, etc.).

Pos_state is an example of an offset value based on the dictionary reset and dictionary size. Because pos_state includes four least significant bits, there are 16 possible values for pos_state.

value of literal_pos_state is the same as that of pos_state described above. The literal_bit_mode is an array of 8 values in the 0-2 range, one for each bit positing in the byte, which are 1 or 2 if the previous packet was a *MATCH and it is either the most significant bit position or all the more significant bits in the literal to encode/decode are equal to the bits in the corresponding positions in match_byte, while otherwise it is 0; the choice between the 1 or 2 values depends on the value of the bit at the same position in match_byte. The bit position indicates where location within the literal_bit_mode array.

The bit-tree context is indicative of an expanding set of probability values that are indicative of the probability values at each level of a bit tree. The bit tree is indicative of the probability of bit being a 0 or a 1 for a series of bits based on probability of previous bit being 0 or 1. For instance, for a first bit in a series of bit there is a probability that its value is 0 or 1. Then for the second (next) bit, there is a probability that its value is 0 based on whether the previous bit was 0 or 1, and a probability that its value is 1 based on whether the previous bit was 0 or 1. For the third bit, there is a probability that the third bit is 0 based on whether the previous bits were 00, 01, 10, or 11, and there is probability that the third bit is 1 based on whether the previous bits were 00, 01, 10, or 11, and so forth for bits.

For example, for first bit, assume there is probability that bit is 0 is P0. For the second bit, there is a first probability P1' based on the first bit being 0, and there is a second probability P1" based on the first bit being 1. For the third bit, for the condition where the first bit is 0, and the second bit is 0, there is a first probability P2'. For the third bit, for the condition where the first bit is 0, and the second bit is 1, there is a second probability P2". For the third bit, for the condition where the first bit is 1, and the second bit is 0, there is a third probability P2'''. For the third bit, for the condition where the first bit is 1, and the second bit is 1, there is fourth probability P2''''. In this example with three bits, the bit-tree context is {P0, P1', P1", P2', P2", P2''', and P2''''}. The bit-tree context can expand for examples with more than three bits.

In some examples, for coding bits that represent a symbol such as MATCH, SHORTREP, LONGREP[0], LONGREP[1], LONGREP[2], or LONGREP[3], the value of the state context may be the same for each of the bits. This is because the value of the state context is based on the previous symbols, and these would be the same previous symbols for each bit in the bits used to represent MATCH, SHORTREP, or LONGREP[0-3]. For coding bits that represent a literal, the prev_byte_lc_msbs context may be the same for each of the bits. This is because the value of prev_byte_lc_msbs is equal to the four most significant bits of the previous uncompressed byte, and the previous uncompressed byte is the same for all the bits used to represent the literal.

RED block 208 may be configured to determine that for each bit of a plurality of bits used to represent a symbol such as MATCH, SHORTREP, LONGREP[0], LONGREP[1], LONGREP[2], or LONGREP[3], the value of the state context is the same. Similarly, RED block 208 may be configured to determine that for each bit of a plurality of bits used to represent a literal, the value of the prev_byte_lc_msbs context is the same. Accordingly, in one or more examples, to code (e.g., encode or decode) a symbol such as a length, distance pair, RED block 208 may retrieve all potential probability values (e.g., speculative probability values) associated with the state context after determining the value of the state context. The actual probability values for the bits in the plurality of bits would be included in the retrieved probability values because all potential probability values associated with the particular value of the state context are retrieved, and the value of the state context is the same for each of the bits. To code a symbol such as a literal, RED block 208 may retrieve all potential probability values (e.g., speculative probability values) associated with the prev_byte_lc_msbs context after determining the value of the prev_byte_lc_msbs context. The actual probability values for the bits in the plurality of bits would be included in the retrieved probability values because all potential probability values associated with the particular value for the prev_byte_lc_msbs are retrieved, and the value of the prev_byte_lc_msbs context is the same for each of the bits.

As an example, on-chip memory 134 stores a table of probability values where the rows of the table of probability values correspond to the value of the state index, and each row has 16 entries, where each of the 16 entries corresponds to a value of pos_state. In this example, RED block 208 determines the context value for the state context (e.g., 0 to 11), and accesses the row of the table of probability values indexed by the context value for the state context. RED block 208 then retrieves all 16 probability values stored in the row of the table of probability values indexed by the context value for the state context. In this example, RED block 208 retrieves all potential probability values (e.g., which are speculative probability values) for all possible context values of the pos_state context. Then for each bit of the plurality of bits, the probability values used to code that bit is going to be one of the retrieved probability value.

FIG. 9 is a conceptual diagram illustrating an example of a table of probability values stored in on-chip memory 134. FIG. 9 illustrates an example to assist with understanding the single read of plurality of probability values where a context value for a first context is the same for a plurality of bits. In the example illustrated in the FIG. 9, the rows are indexed by a context value of the state context, and the columns are indexed by a context value of the pos_state context. As one example, the probability value stored at context value of the state context equal to 4, and the context value of the pos_state context equal to 12 is M. Accordingly, by determining the context value for the state context and the pos_state context, RED block 208 may determine the probability value used to encode or decode bits of a plurality of bits.

As an example, assume that RED block 208 determined that the current state value is 4. For instance, referring back to table 3, in this example, the previous symbol was a literal, and the $2^{nd}$ previous (e.g., previous to the previous) symbol as a match, and therefore, the current state value is 4. For the plurality of bits that are to be coded (e.g., encoded or decoded) for the current symbol, the context value for the state context will also be 4. For instance, for each bit in the plurality of bits for the current symbol, the previous symbol was a literal and the $2^{nd}$ previous symbol was a match. As an example, assume that the plurality of bits for the current symbol are 10110100. In this example, for the first bit "1", the previous symbol was a literal and the $2^{nd}$ previous symbol was a match, for the second bit "0", the same is true, the previous symbol was a literal and the $2^{nd}$ previous symbol was a match, for the third bit "1", again, the previous symbol was a literal and the $2^{nd}$ previous symbol was a match, and so forth.

Although the context value for the state context is the same for each bit of the plurality of bits, the context value for the pos_state context may be different for two or more of the plurality of bits. For example, the context value for the pos_state for the first bit and the second bit may be different, but the context value of the state context for the first bit and the second bit is the same (e.g., 4 in this example). The context value for the pos_state may be different because they symbol could be length, distance pair and length needs to be coded for setting the value of pos_state.

RED block 208 may be configured to retrieve speculative probability values for a context that is the same for each bit of the plurality of bits from on-chip memory 134. For example, RED block 208 may retrieve all potential probability values (e.g., speculative probability values) stored in the row of the table of probability values indexed by a context value of the state context equal to 4. In this example, RED block 208 may retrieve probability values A-P from on-chip memory 134. Each one of probability values A-P are associated with different values of pos_state. For instance, probability value A is associated with the context value of the pos_state context being equal to 0, probability value B is associated with the context value of the pos_state context being equal to 1, and so forth. RED block 208 stores the retrieved probability values in local memory for fast, low-power access. For both encoding and decoding, RED block 208 may retrieve the speculative probability values for storing in local memory in response to a single read instruction issued to on-chip memory 134 (e.g., by RED block 208 or by a processing core).

For encoding, for each bit of the plurality of bits, RED block 208 may determine the context value of the pos_state context. For example, if the current symbol is represented by current symbol are 10110100, then for the first bit "1", RED block 208 may determine the context value for the pos_state context, for the second bit "0", RED block 208 may determine the context value for the pos_state context, and so forth. Based on the determined context values for the pos_state, RED block 208 may determine the probability values from the retrieved speculative probability values stored in the local memory. Based on the probability values, RED block 208 may range encode the plurality of bits on a bit-by-bit basis.

On the decode side, on a bit-by-bit basis, RED block 208 may determine the context values and determine the probability values based on the context values. Similar to above, if the context value for a context is the same for a plurality of bits, for decoding, RED block 208 may retrieve the speculative probability values and locally store the speculative probability values for fast, low-power access. RED block 208 may apportion the range space based on the determined probability values, and based on the received encoded data stream, determine the sub-portion within which the encoded data stream belongs. From the determined sub-portion, RED block 208 may determine the actual bit value.

FIG. 9 illustrates an example of the table of probability values for symbols such as LONGREP[*], SHORTREP, and MATCH. The same techniques can be applied to other examples of symbols such as LIT (literals). For instance, for literals, the context value for the prev_byte_lc_msbs context may be the same for each bit of the plurality of bits because the four most significant bits of the previous uncompressed byte will be the same for each of the bits in the plurality of bits used to represent the current symbol. However, the context values for the literal_pos_state context, literal_bit_mode context, or the bit-tree context may be different for each bit.

In the example illustrated in FIG. 9, RED block 208 retrieves speculative probability values (e.g., prefetches probability values for the plurality of bits) because the index to retrieve probability values from the table of probabilities for each bit in the plurality of bits of the current symbol is known as soon as the encoding/decoding for the previous symbol is complete. For symbols such as literals, one of the contexts may be the bit values of bits in corresponding locations in a previous byte. In some examples, RED block 208 may also retrieve speculative probability values for the bits of the current symbol as soon as the bit values of the bits in corresponding locations in a previous byte are known.

As described above, in some examples, RED block 208 switches coding packets between different data streams. In some examples, prior to switching or as part of the switching, processing circuitry (e.g., RED block 208 or some other processing circuitry alone or in combination with RED block 208) compresses the state information used to code packets. The table of probability values illustrated in FIG. 9 is one example of state information. Other examples of state information include the low and range values.

Although not specifically shown in FIG. 9, each of the locations within the table of probability values indicates a probability value. RED block 208 may generate the table of probability values based on default values, and then update the default values as RED block 208 determines updated probability values based on the incoming data stream.

In some examples, to perform compression of the table of probability values, the processing circuitry may only retrieve non-default values from the table of probability values. The processing circuitry may store information that indicates where each of the non-default values was located within the table of probability values (e.g., as an (x, y) location). Rather than only retrieving non-default values, in some examples, the processing circuitry may retrieve probability values only from rows (or columns) that store at least one non-default value. In these examples, there may be probability values in a row (or column) that are default probability values that are retrieved and stored, but there is at least one non-default value in the row (or column). In these examples, the processing circuitry may store an index into row (or column) and the probability values of that row (or column). For example, assuming that at least one of probability values A-P is a non-default value, the processing circuitry may store probability values A-P of row 4 (e.g., 16 entries indexed with row 4). As another example, the processing circuitry may run-length code the table of probability values to compress the state information.

The processing circuitry may be configured to scan through the table of probability values to determine which ones are non-default values. To improve the scanning process for saving and later restoring, the rows (or columns) of the table of probability values may be organized into pages of memory. For instance, each page may be configured to store approximate 4 kB of data, and is an easily accessible, discrete unit of memory. Hence, by organizing rows (or columns) as pages, the processing circuitry may retrieve a row (or column) with access to a single page, and not need to track within each page, where one row (or column) of probability values ended, and the next one began.

After compressing the state information, RED block 208 may switch to coding from the first data stream to a second data stream. When RED block 208 switches back to the first data stream, the processing circuitry retrieves the compressed state information and decompress the state information to reconstruct the state information. As part of the reconstructing the state information, the processing circuitry may regenerate the table of probability values.

In some examples, to reduce the time taken to regenerate the table of probability values, the processing circuitry, as part of compressing the state information prior to switching, may generate a bitmask for each row (or column) of the table of probability values that indicates whether that particular row (or column) contains default values only or not. Whenever a row (or column) needs to be updated, the processing circuitry modifies the bitmask to indicate that a default value was modified and the entire row (or column) is updated with default values except the entry being modified. The use of the bitmask may allow initialization of the table of probability values within a single cycle.

Figure 10:
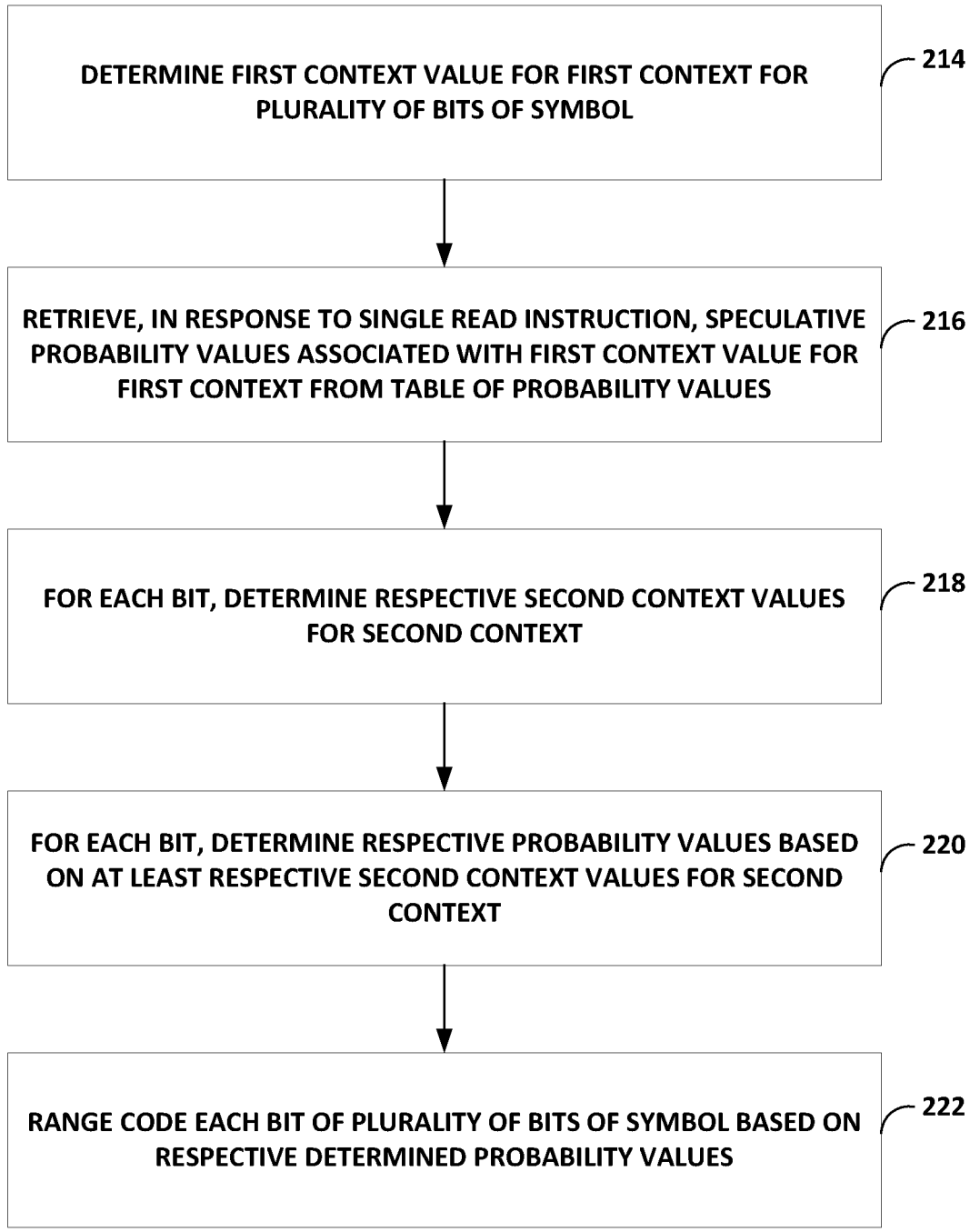
FIG. 10 is a flowchart illustrating one or more example method of operations in accordance with this disclosure.

FIG. 10 is a flowchart illustrating one or more example method of operations in accordance with this disclosure. RED block 208, which is an example of a range coder implemented in circuitry of a device, determines a first context value for a first context for a plurality of bits of a symbol to be coded (214). In this example, the first context value for the first context is the same for the plurality of bits. Examples of the symbol include a literal of a byte string, or a length, distance pair indicating a distance value to a previous occurrence of a matching byte string and a length value of the match. As one example, a context value of a state context is the same for a plurality of bits used to represent a MATCH, SHORTREF, or LONGREF[0-3] symbol (e.g., length, distance pair symbols). As described above, the state context is based on a classification of symbols coded prior to the symbol to be coded (e.g., the previous four symbol types). As another example, a context value for the prev_byte_lc_msbs is the same for a plurality of bits used to represent a literal symbol. As described above, the prev_byte_lc_msbs is the four most significant bits of a previous uncompressed byte.

RED block 208 may retrieve, in response to a single read instruction issued to on-chip memory 134, speculative probability values associated with the first context value for the first context from a table of probability values stored in on-chip memory 134 (216). For example, RED block 208 may retrieve, in response to a single read instruction issued to on-chip memory 134, all of the probability values associated with the context value of the state context equal to four, as illustrated in FIG. 9. As an example, illustrated in FIG. 9, the retrieving of probability values from on-chip memory 134 includes storing the table of probability values arranged in contiguous memory locations with on-chip memory 134. The contiguous memory locations may be arranged in a row of physical memory locations within the external memory or in a column of physical memory locations within on-chip memory 134.

For instance, the table of probability values is arranged as a two-dimensional structure of memory locations (e.g., as illustrated in FIG. 9). RED block 208 may determine a row or column in the two-dimensional structure of memory locations indexed by the first context value of the first context (e.g., the index in the rows of the table of probability values in FIG. 9 is four, which is the context value of the state context). In this example, RED block 208 may retrieve all of the speculative probability values stored in the row or column indexed by the first context value of the first context. One example of the speculative probability values is all potential probability values for all of the bits in the plurality of bits.

There may be other example ways in which to retrieve speculative probability values. For example, in some cases, which index to read from the table of probability values for a current bit depends on which bit was encoded or decoded last. Accordingly, in some examples, RED block 208 may read multiple locations from the table of probability values to prefetch probability values for subsequent bits as soon as their indices into the table of probability values can be determined.

As one example, assume that the symbol being coded is a current symbol. RED block 208 may determine one or more indices in the table of probability values for bits of a next symbol while range coding the current symbol. In this example, RED block 208 may retrieve speculative probability values for the next symbol based on the determination while range coding the current symbol. In this example, RED block 208 may prefetch all the probabilities needed for the next symbol as soon as their index is available while coding the current symbol. As another example, RED block 208 may prefetch all dependent probabilities for next bits in the current symbol using already decoded bits in the current symbol.

RED block 208 may determine, for each bit of the symbol, respective second context values for a second context (218). For example, RED block 208 may determine the context value for the pos_state context for each bit of the plurality of bits for a MATCH, SHORTREF, or LONGREF[0-3] symbols. As another example, RED block 208 may determine the context value for the literal_pos_state context for each bit of the plurality of bits for a literal symbol. The pos_state and the literal_pos_state are examples of an offset value based on a dictionary (e.g., history) position. In this example, the context value for the second context for a first bit of the plurality of bits is different than the context value for the second context for a second bit of the plurality of bits. But, the context value for the first context is the same for each bit of the plurality of bits.

For each bit, RED block 208 may determine respective probability values based on at least respective second context values for the second context (220). For instance, rather than retrieving the probability values from on-chip memory 134, RED block 208 retrieves the probability values from its local memory where RED block 208 stored the retrieved speculative probability values. In this way, RED block 208 is configured to determine the probability value for range coding bits of a plurality of bits with limited accesses to on-chip memory 134.

RED block 208 may range encode or decode each of the plurality of bits of symbols based on respective determined probability values (222). As one example, RED block 208 determines the range and low values used for range coding based on the determined probability values.

Figure 11:
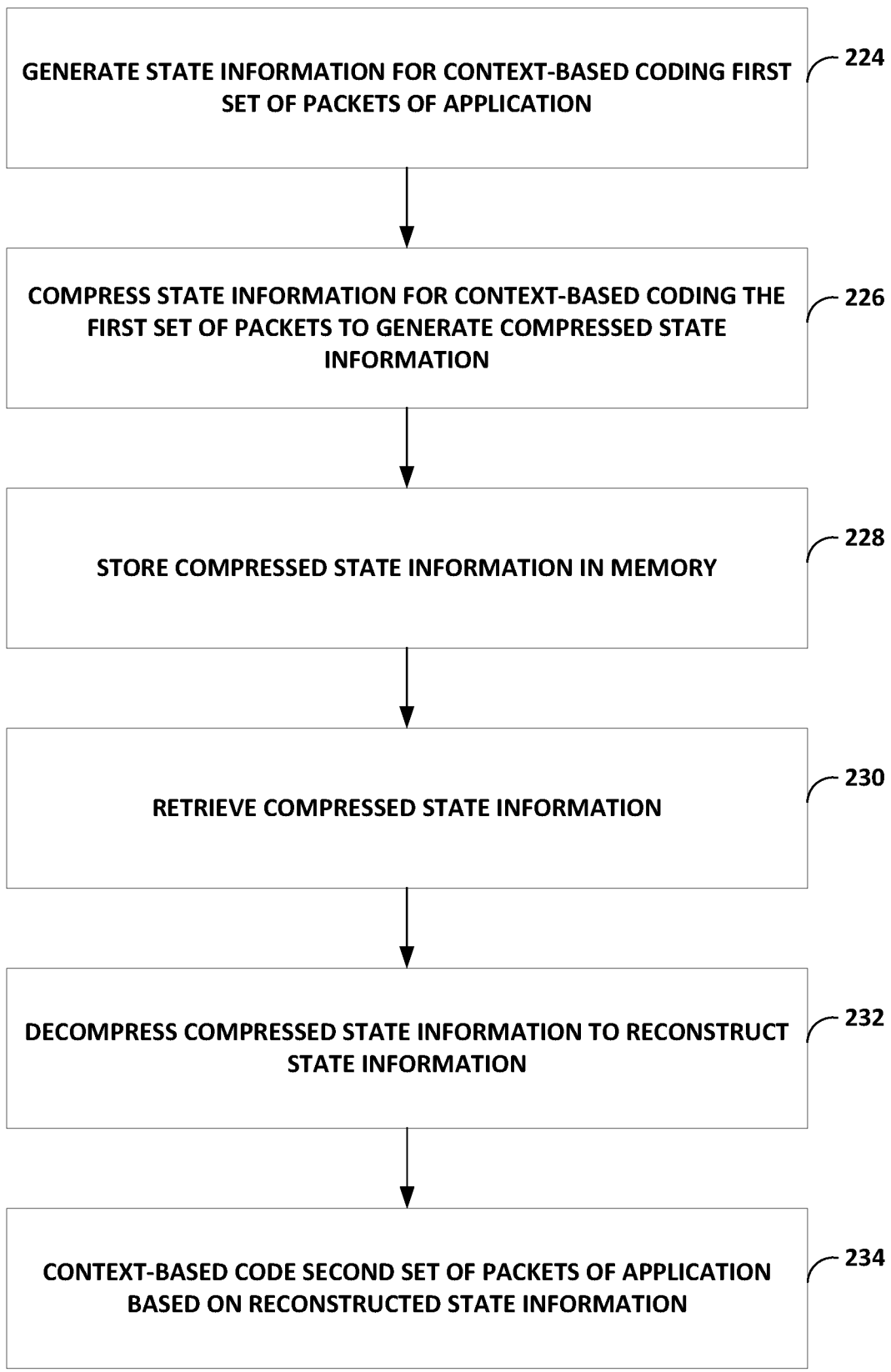
FIG. 11 is a flowchart illustrating one or more example method of operations in accordance with this disclosure.

FIG. 11 is a flowchart illustrating one or more example method of operations in accordance with this disclosure. RED block 208, which is an example of a range coder implemented in circuitry of a device, is configured to perform the example techniques described in FIG. 11. However, the example techniques are not so limited, and generally, processing circuitry, in combination with RED block 208, may be configured to perform the example techniques.

RED block 208 generates state information for context-based coding a first set of one or more packets of an application (224). As described with respect to FIG. 8, as RED block 208 codes symbols, RED block 208 may update the range and low values and the table of probability values, which are examples of the state information. For instance, RED block 208 may generate a table of probability values with default values, and update the default values based on the probability distribution of the symbols that RED block 208 is coding. RED block 208 compresses the state information for context-based coding the first set of one or more packets to generate compressed state information (226). As one example, RED block 208 may receive a command that instructs RED block 208 to switch from coding packets in a first data stream generated from execution of the application (e.g., first application) to code packets in a second data stream generated from execution of a second application. In response to the command, RED block 208 may be configured to compress the state information RED block 208 had generated to code the first set of one or more packets of the first application so that the state information is in a form that can be stored without requiring extensive memory bandwidth. For example, RED block 208 may compress the state information after coding the set of one or more packets.

The set of one or more packets of the application may be considered as a data chunk. Therefore, compressing the state information after coding the first set of one or more packets may be considered as compressing the state information at a data chunk boundary. Compressing the state information at a data chunk boundary facilitates the interleaving of data streams. For instance, the data chunk boundary is at the end of a packet of a first data stream, allowing for RED block 208 to start coding starting form the end of the data chunk boundary when RED block 208 returns back to coding the packets of the first data stream.

There may be various way in which RED block 208 compresses the state information. As one example, the state information includes a table of probability values arranged as a plurality of rows or columns. In such examples, compressing the state information includes RED block 208 determining which rows or columns of the plurality of rows or columns of the table of probability values include non-default values, and retrieving values only from one of rows or columns of the plurality of rows or columns of the table of probability values that include non-default values. RED block 208 may also generate a bitmask that indicates which rows or columns of the table of probability values have non-default values. As another example, RED block 208 may perform run-length coding of the table of probability values.

RED block 208 stores the compressed state information in memory (228). For example, RED block 208 may store only the retrieved values of the table of probability values, rather than all values of the table of probability values. RED block 228 may also store information indicating locations within the table of probability values from which values are retrieved and store the bitmask.

In some examples, subsequent to storing the compressed state information in the memory, and prior to retrieving the compressed state information from the memory, RED block 208 may context-based code a first set of one or more packets of a second application. For instance, in response to the command to switch to the second data stream, RED block 208 may begin coding packets of the second data stream generated from execution of the second application.

RED block 208 may then receive a command to switch back from the second data stream back to the first data stream. In such cases, RED block 208 may compress state information for context-based coding the first set of one or more packets of the second application to generate second compressed state information, and store the second compressed state information in the memory.

RED block 208 retrieves the compressed state information (230). For example, RED block 208 retrieves the compressed state information subsequent to storing the second compressed state information. RED block 208 decompresses the compressed state information to reconstruct the state information (232). For example, RED block 208 performs the inverse operations used to compress to reconstruct the state information. As an example, RED block 208 reads the bitmask to determine which rows or columns store non-default values, and constructs a table of probability values where each row or column that stores only default values is initialized with default values. For each row or column that stores non-default values, RED block 208 retrieves information indicating where the non-default values are stored in the table of probability values and fills in the non-default values retrieved from the memory based on the information.

RED block 208 context-based codes the second set of one or more packets of the first application based on the reconstructed state information (234). In this way, there may not be any negative impact on the coding efficiencies because the probability distribution information in the first data stream is not lost, but is rather stored and retrieved for use. Also, there is minimal impact on the overhead from storing and retrieving the state information because the amount of data that needs to stored and retrieved is minimized due to the compression.

RED block 208 may then repeat these operations. For example, during context-based coding of the second set of one or more packets, RED block 208 may update the reconstructed state information (e.g., based on updates to the probability values described above with respect to FIG. 8) to generate state information for context-based coding the second set of one or more packets. RED block 208 may compress the state information for context-based coding the second set of one or more packets to generate a second compressed state information (e.g., in response to a command to switch data streams).

RED block 208 may store the second compressed stated information in the memory, and then switch data streams. After returning back to the data stream, RED block 208 may retrieve the second compressed state information from the memory, decompress the second compressed state information to reconstruct the second state information, and context-based code a third set of one or more packets of the application based on the reconstructed second state information.

Various examples have been described. These and other examples are within the scope of the following claims.

What is claimed is:

1. A method of context-based coding, the method comprising:
   determining, by a range coder implemented in circuitry of a device, a first context value for a first context for a plurality of bits of a symbol to be coded, wherein the first context value for the first context is same for the plurality of bits;
   retrieving, by the range coder, speculative probability values associated with the first context value for the first context from a table of probability values;
   for one or more bits of the plurality of bits of the symbol, determining, by the range coder, respective second context values for a second context;
   for the one or more bits of the plurality of bits of the symbol, determining, by the range coder, respective probability values from the retrieved speculative probability values based on at least the respective second context values for the second context; and
   range coding, by the range coder, the one or more bits of the plurality of bits of the symbol based on the respective determined probability values.

2. The method of claim 1, wherein a second context value for a second context for a first bit of the one or more bits is different than a second context value for a second context for a second bit of the one or more bits.

3. The method of claim 1, wherein retrieving comprises retrieving, in response to a single read instruction issued to the on-chip memory.

4. The method of claim 1, wherein retrieving the probability values comprises retrieving the probability values from an on-chip memory storing the table of probability values arranged in contiguous memory locations within the on-chip memory.

5. The method of claim 4, wherein the table of probability values is arranged as a two-dimensional structure of memory locations, wherein retrieving the speculative probability values comprises:
   determining a row or column in the two-dimensional structure of memory locations indexed by the first context value of the first context; and retrieving all of the speculative probability values stored in the row or column indexed by the first context value of the first context.

6. The method of claim 1, wherein the symbol to be coded comprises one of:
   a literal of a byte string; or
   a length, distance pair indicating a distance value to a previous occurrence of a matching byte string and a length value of the match.

7. The method of claim 1, wherein the symbol to be coded comprises a length, distance pair indicating a distance value to a previous occurrence of a matching byte string and a length value of the match, wherein the first context value of the context comprises a context value for a state context based on a classification of symbols coded prior to the symbol to be coded, and the second context value comprises an offset value based on a history position.

8. The method of claim 1, wherein the symbol to be coded comprises a literal of a byte string, and wherein the first context value of the first context comprises four most significant bits of a previous uncompressed byte, and the second context value of the second context comprises an offset value based on a history position.

9. The method of claim 1, wherein retrieving speculative probability values comprises retrieving all potential probability values for all of the bits in the one or more bits.

10. The method of claim 1, wherein the symbol comprises a current symbol, the method further comprising:
    determining one or more indices in the table of probability values for bits of a next symbol while range coding the current symbol; and
    retrieving speculative probability values for the next symbol based on the determination while range coding the current symbol.

11. A device for context-coding, the device comprising:
    memory configured to store a table of probability values; and
    a range coder implemented in circuitry, wherein the range coder is configured to:
      retrieve speculative probability values associated with a first context value for a first context for a plurality of bits of a symbol to be coded from the table of probability values stored in the memory, wherein the first context value for the first context is same for the plurality of bits;
      for one or more bits of the plurality of bits of the symbol, determine respective second context values for a second context;
      for the one or more bits of the plurality of bits of the symbol, determine respective probability values from the retrieved speculative probability values based on at least the respective second context values for the second context; and
      range code the one or more bits of the plurality of bits of the symbol based on the respective determined probability values.

12. The device of claim 11, wherein a second context value for a second context for a first bit of the one or more bits is different than a second context value for a second context for a second bit of the one or more bits.

13. The device of claim 11, wherein to retrieve, the range coder is configured to retrieve, in response to a single read instruction issued to the memory, the speculative probability values.

14. The device of claim 11, wherein to retrieve the probability values, the range coder is configured to retrieve the probability values from the memory storing the table of probability values arranged in contiguous memory locations within the memory.

15. The device of claim 14, wherein the table of probability values is arranged as a two-dimensional structure of memory locations, wherein to retrieve the speculative probability values, the range coder is configured to:
    determine a row or column in the two-dimensional structure of memory locations indexed by the first context value of the first context; and
    retrieve all of the speculative probability values stored in the row or column indexed by the first context value of the first context.

16. The device of claim 11, wherein the symbol to be coded comprises one of:
    a literal of a byte string; or
    a length, distance pair indicating a distance value to a previous occurrence of a matching byte string and a length value of the match.

17. The device of claim 11, wherein the symbol to be coded comprises a length, distance pair indicating a distance value to a previous occurrence of a matching byte string and a length value of the match, wherein the first context value of the context comprises a context value for a state context based on a classification of symbols coded prior to the symbol to be coded, and the second context value comprises an offset value based on a history position.

18. The device of claim 11, wherein the symbol to be coded comprises a literal of a byte string, and wherein the first context value of the first context comprises four most significant bits of a previous uncompressed byte, and the second context value of the second context comprises an offset value based on a history position.

19. The device of claim 11, wherein to retrieve speculative probability values, the range coder is configured to retrieve all potential probability values for all of the bits in the one or more bits.

20. The device of claim 11, wherein the symbol comprises a current symbol, and wherein the range coder is configured to:
    determine one or more indices in the table of probability values for bits of a next symbol while range coding the current symbol; and
    retrieve speculative probability values for the next symbol based on the determination while range coding the current symbol.

21. A device for context-coding, the device comprising:
    a range coder implemented in circuitry, wherein the range coder is configured to:
      retrieve speculative probability values associated with a first context value for a first context for a plurality of bits of a symbol to be coded; and
      range code the one or more bits of the plurality of bits of the symbol based on probability values determined from the retrieved speculative probability values and respective second context values for a second context.

22. The device of claim 21, wherein to retrieve, the range coder is configured to retrieve, in response to a single read instruction issued to the memory, the speculative probability values.

23. The device of claim 21, wherein the device further comprises a memory configured to store a table of probability values arranged as a two-dimensional structure of memory locations, wherein to retrieve the speculative probability values, the range coder is configured to:

determine a row or column in the two-dimensional structure of memory locations indexed by the first context value of the first context; and retrieve all of the speculative probability values stored in the row or column indexed by the first context value of the first context.

24. The device of claim 21, wherein the symbol to be coded comprises one of:

a literal of a byte string; or a length, distance pair indicating a distance value to a previous occurrence of a matching byte string and a length value of the match.

25. The device of claim 21, wherein the symbol to be coded comprises a length, distance pair indicating a distance value to a previous occurrence of a matching byte string and a length value of the match, wherein the first context value of the context comprises a context value for a state context based on a classification of symbols coded prior to the symbol to be coded, and the second context value comprises an offset value based on a history position.

26. The device of claim 21, wherein the symbol to be coded comprises a literal of a byte string, and wherein the first context value of the first context comprises four most significant bits of a previous uncompressed byte, and the second context value of the second context comprises an offset value based on a history position.

* * * * *